United States Patent [19]
Iwanaga et al.

[11] Patent Number: 5,925,903
[45] Date of Patent: Jul. 20, 1999

[54] FIELD-EFFECT TRANSISTORS AND METHOD OF MANUFACTURING THE SAME

[75] Inventors: Junko Iwanaga, Osaka; Yorito Ota, Hyogo; Tadayoshi Nakatsuka, Osaka; Hiroyuki Masato, Osaka; Katsuhiko Kawashima, Osaka, all of Japan

[73] Assignee: Matsushita Electric Industrial Co., Ltd., Osaka, Japan

[21] Appl. No.: 08/991,635

[22] Filed: Dec. 16, 1997

[30] Foreign Application Priority Data

Dec. 18, 1996 [JP] Japan ................................. 8-337875

[51] Int. Cl.$^6$ ................................................ H01L 29/80
[52] U.S. Cl. .......................... 257/284; 257/280; 257/283
[58] Field of Search .................................. 257/280, 281, 257/282, 283, 284, 286, 330

[56] References Cited

U.S. PATENT DOCUMENTS

| | | | |
|---|---|---|---|
| 4,961,194 | 10/1990 | Kuroda et al. | 257/280 |
| 5,821,576 | 10/1998 | Sriram | 257/284 |

FOREIGN PATENT DOCUMENTS

| | | | |
|---|---|---|---|
| 364051666 | 2/1989 | Japan | 257/284 |
| 401061068 | 3/1989 | Japan | 257/283 |
| 09008061 | 1/1997 | Japan . | |
| 09082725 | 3/1997 | Japan . | |

*Primary Examiner*—Tom Thomas
*Assistant Examiner*—Ori Nadav
*Attorney, Agent, or Firm*—McDermott, Will & Emery

[57] ABSTRACT

A conductive layer made of n-type GaAs is formed on a semi-insulating substrate made of GaAs. A pair of contact regions made of n$^+$-type GaAs are formed on the conductive layer. A source electrode is formed on the left-hand contact region, while a drain electrode is formed on the right-hand contact region. A gate recessed region is formed in the region of the conductive layer located between the pair of contact regions so that a gate electrode is formed on the gate recessed region. A depressed portion is formed in the gate recessed region of the conductive layer. The wall face of the depressed portion closer to the gate electrode is flush with or protruding from the side face of the gate electrode facing the drain electrode.

2 Claims, 50 Drawing Sheets

FIELD-EFFECT TRANSISTORS AND METHOD OF MANUFACTURING THE SAME

The present invention relates to field-effect transistors and, more particularly, to a high-output field-effect transistor of which high voltage resistance and high gain are required and to a manufacturing method therefor.

Field-effect transistors (FETs), particularly gallium arsenide (GaAs) FETs, have been in increasingly greater demand as power FETs for transmission amplifiers used in communication equipment, the representative of which is a terminal device for mobile communication. Various improvements required of the performance of a GaAs power FET include higher voltage resistance, higher gain, lower skew, lower power consumption, and lower operating voltage.

However, since a semiconductor device formed on a GaAs substrate cannot have a MOS (Metal Oxide Semiconductor) structure consisting of a semiconductor substrate, a metal electrode film, and an insulating film interposed therebetween, which is used for a semiconductor device on a Si substrate, but should have a MES (Metal Semiconductor) structure, higher voltage resistance is the most difficult to achieve of the foregoing improvements required of the performance of the GaAs power FET.

To increase the voltage resistance of a GaAs FET, there have conventionally been adopted a method of using a recessed gate structure and a method of using a MIS (Metal Insulator Semiconductor) structure.

The recessed gate structure is implemented by selectively etching a semiconductor substrate and forming a gate electrode on the resulting recessed region. The MIS structure has an undoped layer containing no impurity and formed immediately under a gate electrode by epitaxial growth.

Referring to FIG. 46, a MESFET with a recessed gate structure will be described as a first conventional embodiment.

As shown in the drawing, a conductive layer 102 made of n-type GaAs doped with Si as an impurity is formed on a semi-insulating substrate 101 made of GaAs. A pair of contact regions 103 made of GaAs heavily doped with Si as an impurity are formed on the conductive layer 102. The conductive layer 102 and the contact regions 103 have been formed typically by crystal growth. In FIG. 46, there are also shown: a drain electrode 104 and a source electrode 105 formed by vapor depositing AuGe or the like on the respective contact regions 103; a gate electrode 106 formed by vapor depositing Ti/Al or the like on the recessed region of the conductive layer 102; and an element isolation region 107. The contact regions 103, the recessed region of the conductive layer 102, and the element isolation region 107 are typically formed by etching.

Although the MESFET with the gate recessed structure according to the first conventional embodiment has improved in voltage resistance owing to the step formed between the gate electrode and the drain electrode for reduced electric-field intensity, the degree of improvement in voltage resistance is not satisfactory. Under such circumstances, a MESFET with a gate offset structure has been proposed.

Referring to FIG. 47, the MESFET with the gate offset structure will be described as a second conventional embodiment.

As shown in the drawing, a conductive layer 102 made of n-type GaAs doped with Si as an impurity is formed on a semi-insulating substrate 101 made of GaAs. A pair of contact regions 103 made of n-type GaAs heavily doped with Si as an impurity are formed on the conductive layer 102. A drain electrode 104 and a source electrode 105 are formed on the respective contact regions 103. A gate electrode 106 is formed on a recessed region of the conductive layer 102. The second conventional embodiment is similar to the first conventional embodiment except that the gate electrode 106 formed on the recessed region of the conductive layer 102 is offset from the center thereof toward the source electrode 105. Consequently, the distance between the gate electrode 106 and the drain electrode 104 is larger than the distance between the gate electrode 106 and the source electrode 105, resulting in improved voltage resistance.

A description will be given to the result of simulating the voltage-resistant properties of the FETs according to the first and second conventional embodiments by using a device simulator. During the simulation, the voltage-resistant property of the drain electrode was examined by applying a drain voltage thereto, while maintaining source and gate voltages at 0 v.

FIG. 48 is a graph showing gate-electrode-versus-drain-voltage characteristics of the first and second conventional FETs. FIGS. 49 and 50 show respective distributions of equipotential lines in the FETs according to the first and second conventional embodiments, which have been obtained by plotting points having the same potential in 0.05 v steps (logarithmic representation) when the drain voltage is 7.5 v.

As can be understood from FIGS. 48, 49, and 50, a leakage current from the gate electrode is slightly reduced in the second conventional embodiment using the offset gate structure compared with the first conventional embodiment.

However, voltage resistance has not been improved satisfactorily in the second conventional embodiment, though a certain degree of improvement is observed compared with the first conventional embodiment.

As for gain, it has not been improved satisfactorily, either, though a certain degree of improvement is observed compared with the first conventional embodiment.

SUMMARY OF THE INVENTION

In view of the foregoing, it is therefore an object of the present invention to significantly improve the gate-to-drain voltage resistance as well as gain of a field-effect transistor.

To attain the object, the present invention has provided first and second means for solving the foregoing problems: a depressed portion formed in the surface region of a semiconductor substrate located between the gate electrode and the drain electrode; and a step formed in the surface of the semiconductor substrate to have an upper portion, a lower portion, and a vertical portion on which the gate electrode and the drain electrode are provided, respectively.

A first field-effect transistor according to the present invention comprises: a semiconductor substrate; a conductive layer formed on the semiconductor substrate; a source electrode and a drain electrode formed on respective specified regions of the conductive layer to be in ohmic contact with the conductive layer; a gate electrode formed on a region of the conductive layer located between the source electrode and the drain electrode to form a Schottky junction with the conductive layer; and a depressed portion formed in a region of the conductive layer located between the gate electrode and the drain electrode.

In the first field-effect transistor, the depressed portion is provided in the region of the conductive layer located between the gate electrode and the drain electrode so that equipotential lines, which have been localized in the region of the conductive layer underlying the drain-side end of the gate electrode in the conventional structure, are also distributed in the region of the conductive layer underlying the depressed portion. Consequently, the electric-field intensity between the gate electrode and the drain electrode is reduced, resulting in improved gate-to-drain voltage resistance.

In the first field-effect transistor, a side face of the gate electrode facing the drain electrode is preferably flush with or protruding from a wall face of the depressed portion closer to the gate electrode.

By thus etching the conductive layer by using the gate electrode as a mask, the depressed portion is surely formed in the conductive layer. The depressed portion formed in the region of the conductive layer located between the gate electrode and the drain electrode reduces a depletion layer in the region of the conductive layer located between the gate electrode and the drain electrode, resulting in reduced capacitance between the gate electrode and the drain electrode and higher power gain.

In the first field-effect transistor, a given spacing is preferably provided between the gate electrode and a wall face of the depressed portion closer to the gate electrode.

In the arrangement, equipotential lines are separately distributed in the region of the conductive layer underlying the drain-side end of the gate electrode and in the region of the conductive layer underling the depressed portion, so that the electric-field intensity between the gate electrode and the drain electrode is further reduced, resulting in further improved gate-to-drain voltage resistance.

In the first field-effect transistor, the depressed portion preferably includes a plurality of depressed portions formed in the region of the conductive layer located between the gate electrode and the drain electrode.

In the arrangement, equipotential lines are separately distributed in the individual regions of the conductive layer underlying the plurality of depressed portions, so that the electric-field intensity between the gate electrode and the drain electrode is further reduced, resulting in further improved gate-to-drain voltage resistance.

A second field-effect transistor according to the present invention comprises: a semiconductor substrate; a conductive layer formed on the semiconductor substrate; a semiconductor layer formed on the conductive layer; a source electrode and a drain electrode formed on respective specified regions of the semiconductor layer to be in ohmic contact with the semiconductor layer; a gate electrode formed in a region of the semiconductor layer located between the source electrode and the drain electrode to form a Schottky junction with the semiconductor layer; and a depressed portion formed in a region of the semiconductor layer located between the gate electrode and the drain electrode.

In the second field-effect transistor, the depressed portion is formed in the region of the semiconductor layer located between the gate electrode and the drain electrode so that equipotential lines, which have been localized in the region of the semiconductor layer underlying the drain-side end of the gate electrode in the conventional structure, are also distributed in the region of the semiconductor layer underlying the depressed portion. Consequently, the electric-field intensity between the gate electrode and the drain electrode is reduced, resulting in improved gate-to-drain voltage resistance.

In the second field-effect transistor, a side face of the gate electrode facing the drain electrode is preferably flush with or protruding from a wall face of the depressed portion closer to the gate electrode.

By thus etching the semiconductor layer by using the gate electrode as a mask, the depressed portion is surely formed in the semiconductor layer. The depressed portion formed in the region of the semiconductor layer located between the gate electrode and the drain electrode reduces a depletion layer in the region of the conductive layer located between the gate electrode and the drain electrode, resulting in reduced capacitance between the gate electrode and the drain electrode and higher power gain.

In the second field-effect transistor, a given spacing is preferably provided between the gate electrode and a wall face of the depressed portion closer to the gate electrode.

In the arrangement, equipotential lines are separately distributed in the region of the semiconductor layer underlying the drain-side end of the gate electrode and in the region of the semiconductor layer underling the depressed portion, so that the electric-field intensity between the gate electrode and the drain electrode is further reduced, resulting in further improved gate-to-drain voltage resistance.

In the second field-effect transistor, the depressed portion preferably includes a plurality of depressed portions formed in the region of the semiconductor layer located between the gate electrode and the drain electrode.

In the arrangement, equipotential lines are separately distributed in the individual regions of the semiconductor layer underlying the plurality of depressed portions, so that the electric-field intensity between the gate electrode and the drain electrode is further reduced, resulting in further improved gate-to-drain voltage resistance.

In the second field-effect transistor, the semiconductor layer is preferably composed of an electron supplying layer and a non-doped layer formed sequentially on the conductive layer.

The arrangement improves the gate-to-drain voltage resistance in the field-effect transistor with a quantum-well structure formed of a hetero junction.

A third field-effect transistor according to the present invention comprises: a semiconductor substrate; a conductive layer formed on the semiconductor substrate; a step formed in the conductive layer to have an upper portion, a lower portion, and a vertical portion; a source electrode formed on the upper portion of the step to be in ohmic contact therewith; a gate electrode formed on the upper portion of the step to form a Schottky junction therewith; and a drain electrode formed on the lower portion of the step to be in ohmic contact therewith.

In the third field-effect transistor, the step is formed in the conductive layer so that the gate electrode is formed on the upper portion of the step and that the drain electrode is formed on the lower portion of the step. As a result, equipotential lines which have been localized in the region of the conductive layer underlying the drain-side end of the gate electrode are also distributed in the lower portion of the step formed in the conductive layer. Consequently, the electric-field intensity between the gate electrode and the drain electrode is reduced, resulting in improved gate-to-drain voltage resistance.

In the third field-effect transistor, a side face of the gate electrode facing the drain electrode is preferably flush with or protruding from the vertical portion of the step.

In the arrangement, the side face of the gate electrode facing the drain electrode is flush with or protruding from the vertical portion of the step, so that the step is surely formed in the conductive layer through etching performed with respect to the conductive layer by using the gate electrode as a mask. The step formed in the conductive layer reduces a depletion layer in the region of the conductive layer located between the gate electrode and the drain electrode, resulting in reduced capacitance between the gate electrode and the drain electrode and higher power gain.

In the third field-effect transistor, a given spacing is preferably provided between the gate electrode and the vertical portion of the step.

In the arrangement, equipotential lines are separately distributed in the region of the conductive layer underlying the drain-side end of the gate electrode and in the lower portion of the step formed in the conductive layer, so that the electric-field intensity between the gate electrode and the drain electrode is further reduced, resulting in further improved gate-to-drain voltage resistance.

In this case, the third field-effect transistor preferably further comprises a depressed portion formed between the gate electrode on the upper portion of the step and the vertical portion of the step.

In the arrangement, equipotential lines are separately distributed in the region of the conductive layer underlying the depressed portion and in the lower portion of the step formed in the conductive layer, so that the electric-field intensity between the gate electrode and the drain electrode is further reduced, resulting in further improved gate-to-drain voltage resistance.

A fourth field-effect transistor according to the present invention comprises: a semiconductor substrate; a conductive layer formed on the semiconductor substrate; a semiconductor layer formed on the conductive layer; a step formed in the semiconductor layer to have an upper portion, a lower portion, and a vertical portion; a source electrode formed on the upper portion of the step to be in ohmic contact therewith; a gate electrode formed on the upper portion of the step to form a Schottky junction therewith; and a drain electrode formed on the lower portion of the step to be in ohmic contact therewith.

In the fourth field-effect transistor, the step is formed in the semiconductor layer so that the gate electrode is formed on the upper portion of the step and that the drain electrode is formed on the lower portion of the stepped portion. As a result, equipotential lines, which have been localized in the region of the semiconductor layer underlying the drain-side end of the gate electrode in the conventional structure, are also distributed in the lower portion of the step formed in the semiconductor layer. Consequently, the electric-field intensity between the gate electrode and the drain electrode is reduced, resulting in improved gate-to-drain voltage resistance.

In the fourth field-effect transistor, a side face of the gate electrode facing the drain electrode is preferably flush with or protruding from the vertical portion of the step.

In the arrangement, the side face of the gate electrode facing the drain electrode is flush with or protruding from the vertical portion of the step, so that the step is surely formed in the semiconductor layer through etching performed with respect to the semiconductor layer by using the gate electrode as a mask. The step formed in the semiconductor layer reduces a depletion layer in the region of the semiconductor layer located between the gate electrode and the drain electrode, resulting in reduced capacitance between the gate electrode and the drain electrode and higher power gain.

In the fourth field-effect transistor, a given spacing is preferably provided between the gate electrode and the vertical portion of the step.

In the arrangement, equipotential lines are separately distributed in the region of the semiconductor layer underlying the drain-side end of the gate electrode and in the lower portion of the step formed in the semiconductor layer, so that the electric-field intensity between the gate electrode and the drain electrode is further reduced, resulting in further improved gate-to-drain voltage resistance.

In this case, the fourth field-effect transistor preferably further comprises a depressed portion formed between the gate electrode on the upper portion of the step and the vertical portion of the step.

In the arrangement, equipotential lines are separately distributed in the region of the semiconductor layer underlying the depressed portion and in the lower portion of the step formed in the semiconductor layer, so that the electric-field intensity between the gate electrode and the drain electrode is further reduced, resulting in further improved gate-to-drain voltage resistance.

In the fourth field-effect transistor, the semiconductor layer is preferably composed of an electron supplying layer and a non-doped layer formed sequentially on the conductive layer.

The arrangement improves gate-to-drain voltage resistance in the field-effect transistor with a quantum-well structure including a hetero junction.

A first method of manufacturing a field-effect transistor comprises the steps of: sequentially forming, by crystal growth, a conductive layer doped with an impurity and a contact layer heavily doped with an impurity on a semiconductor substrate; forming a source electrode and a drain electrode on a pair of specified regions of the contact layer having a given spacing therebetween, while selectively etching the contact layer and thereby exposing a region of the conductive layer located between the pair of specified regions of the contact layer to form an exposed portion; forming a gate electrode on the exposed portion of the conductive layer; and forming a depressed portion in a region of the exposed portion of the conductive layer located between the gate electrode and the drain electrode.

In accordance with the first method of manufacturing a field-effect transistor, the gate electrode is formed in the region of the conductive layer exposed between the source electrode and the drain electrode, while the depressed portion is formed in the exposed portion of the conductive layer located between the gate electrode and the drain electrode. This ensures the manufacturing of the first field-effect transistor having the depressed portion in the region of the conductive layer located between the gate electrode and the drain electrode.

A second method of manufacturing a field-effect transistor comprises the steps of: forming, by ion implantation, a conductive layer doped with an impurity in a semiconductor substrate; forming, by ion implantation, contact layers heavily doped with an impurity in a pair of specified regions of the conductive layer having a given spacing therebetween; forming a source electrode and a drain electrode on the respective contact layers, while forming a gate electrode on the conductive layer; and forming a depressed portion in a region of the conductive layer located between the gate electrode and the drain electrode.

In accordance with the second method of manufacturing a field-effect transistor, the source electrode and the drain electrode are formed on the contact layers overlying the specified regions of the conductive layer and the gate electrode is formed on the region of the conductive layer located between the contact layers, while the depressed portion is formed in the region of the conductive layer located between the gate electrode and the drain electrode. This ensures the manufacturing of the first field-effect transistor having the depressed portion in the region of the conductive layer located between the gate electrode and the drain electrode.

A third method of manufacturing a field-effect transistor comprises the steps of: sequentially forming, by crystal growth, a conductive layer doped with an impurity, a semiconductor layer, and a contact layer heavily doped with an impurity on a semiconductor substrate; forming a source electrode and a drain electrode on a pair of specified regions of the contact layer having a given spacing therebetween, while selectively etching the contact layer and thereby exposing a region of the semiconductor layer located between the pair of specified regions of the contact layer to form an exposed portion; forming a gate electrode on the exposed portion of the semiconductor layer; and forming a depressed portion in a region of the exposed portion of the semiconductor layer located between the gate electrode and the drain electrode.

In accordance with the third method of manufacturing a field-effect transistor, the gate electrode is formed on the region of the semiconductor layer exposed between the source electrode and the drain electrode, while the depressed portion is formed in the exposed portion of the semiconductor layer located between the gate electrode and the drain electrode. This ensures the manufacturing of the second field-effect transistor having the depressed portion in the exposed portion of the semiconductor layer located between the gate electrode and the drain electrode.

A fourth method of manufacturing a field-effect transistor comprises the steps of: sequentially forming, by crystal growth, a conductive layer doped with an impurity and a contact layer heavily doped with an impurity on a semiconductor substrate; forming a source electrode on a specified region of the contact layer, while selectively etching the region of the contact layer other than the specified region and thereby exposing the conductive layer to form an exposed portion; forming a gate electrode on the exposed portion of the conductive layer, while forming a step in a region of the exposed portion of the conductive layer in which the gate electrode is not formed, the step having an upper portion, a lower portion, and a vertical portion; and forming a drain electrode on the lower portion of the step.

In accordance with the fourth method of manufacturing a field-effect transistor, the gate electrode is formed on the region of the conductive layer exposed between the source electrode and the drain electrode and the step is formed in the exposed portion of the conductive layer located between the gate electrode and the drain electrode, while the drain electrode is formed on the lower portion of the step. This ensures the manufacturing of the third field-effect transistor having the gate electrode on the upper portion of the step formed in the conductive layer and having the drain electrode on the lower portion of the step.

A fifth method of manufacturing a field-effect transistor comprises the steps of: sequentially forming, by crystal growth, a conductive layer doped with an impurity, a semiconductor layer, and a contact layer heavily doped with an impurity on a semiconductor substrate; forming a source electrode on a specified region of the contact layer, while selectively etching the region of the contact layer other than the specified region and thereby exposing the semiconductor layer to form an exposed portion; forming a gate electrode on the exposed portion of the semiconductor layer, while forming a step in a region of the exposed portion of the semiconductor layer in which the gate electrode is not formed, the step having an upper portion, a lower portion, and a vertical portion; and forming a drain electrode on the lower portion of the step.

In accordance with the fifth method of manufacturing a field-effect transistor, the gate electrode is formed on the region of the semiconductor layer exposed between the source electrode and the drain electrode and the step is formed in the exposed portion of the semiconductor layer, while the drain electrode is formed on the lower portion of the step. This ensures the manufacturing of the fourth field-effect transistor having the gate electrode on the upper portion of the step formed in the semiconductor layer and having the drain electrode on the lower portion of the step.

Figure 1A:
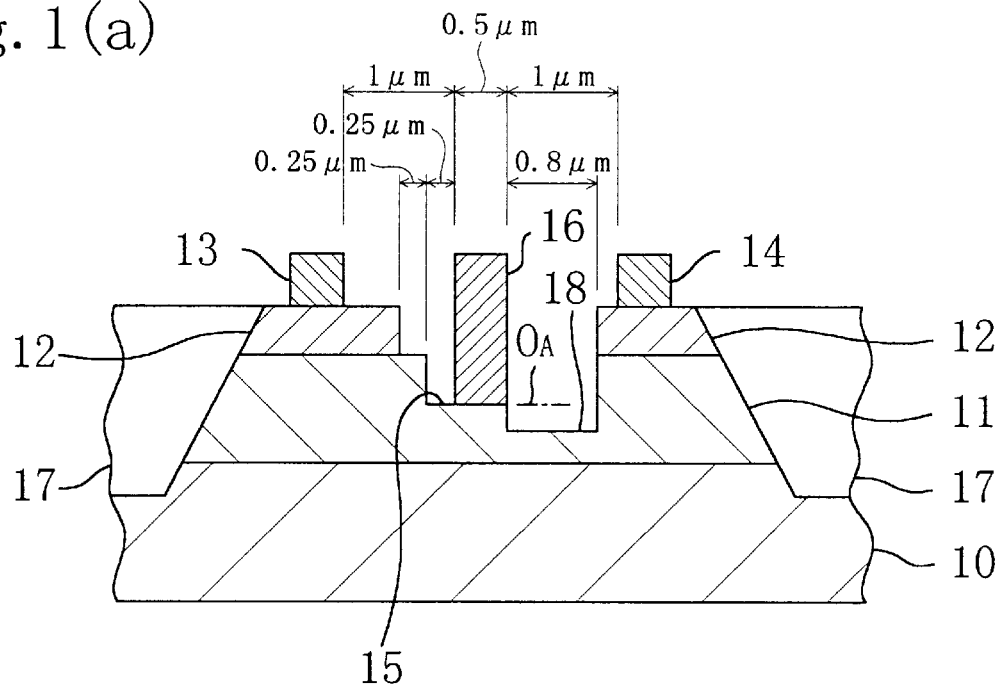
FIG. 1(a) and 1(b) are cross-sectional views of a MESFET as a FET according to a first embodiment of the present invention.

DETAILED DESCRIPTION OF THE INVENTION (First FET of First Embodiment)

A first FET according to a first embodiment of the present invention will be described.

FIGS. 1($a$) and 1($b$) show the cross-sectional structure of a MESFET as the first FET according to the first embodiment. As shown in the drawings, a conductive layer 11 made of n-type GaAs doped with Si as an impurity is formed on a semi-insulating substrate 10 made of GaAs. A pair of contact regions 12 made of $n^+$-type GaAs heavily doped with Si as an impurity and having a given spacing therebetween are formed on the conductive layer 11. In this case, the conductive layer 11 and the contact regions 12 are formed by crystal growth. A source electrode 13 composed of a vapor deposited layer of AuGe or the like is formed on the left-hand contact region 12, while a drain electrode 14 composed of a vapor deposited layer of AuGe or the like is formed on the right-hand contact region 12. The source electrode 13 and the drain electrode 14 are in ohmic contact with the respective contact regions 12.

A gate recessed region 15 is formed in the region of the conductive layer 11 located between the pair of contact regions 12 such that a gate electrode 16 is formed on the gate recessed region 15 to form a Schottky junction with the conductive layer 11. An element isolation region 17 is formed around the conductive layer 11 and the contact regions 12.

Figure 1B:
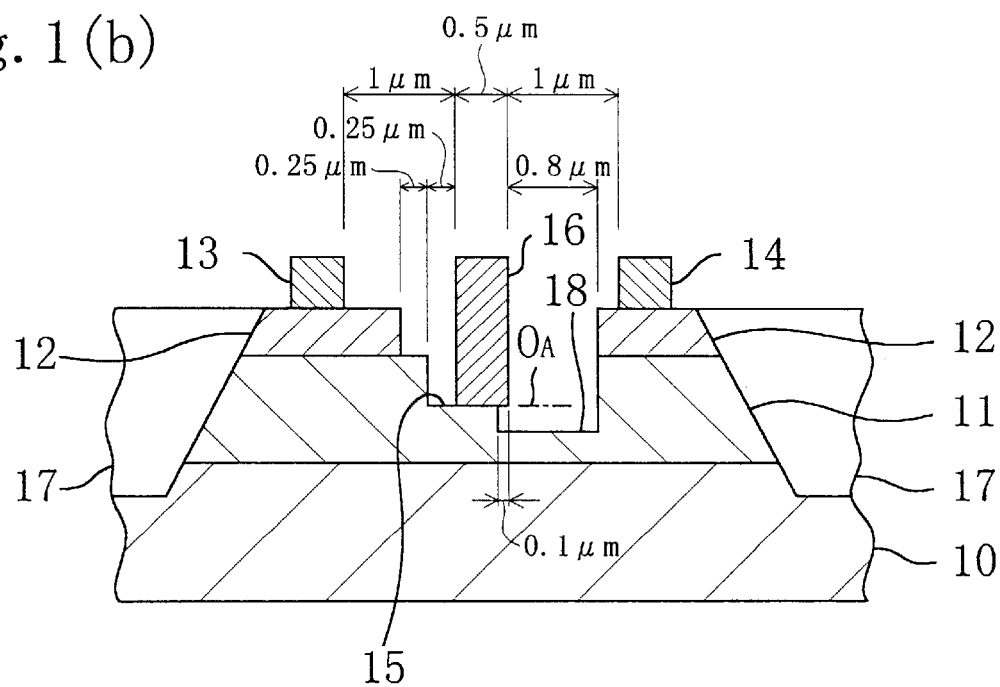

The first FET according to the first embodiment is characterized in that a depressed portion 18 is formed in the gate recessed region 15 of the conductive layer 11. In this case, the side face of the gate electrode 16 facing the drain electrode 14 may be flush with or protruding from the wall face of the depressed portion 18 closer to the gate electrode 16, as shown in FIGS. 1(a) and 1(b). By thus forming the depressed portion 18 extending laterally to a point immediately under the gate electrode 16 through isotropic etching, the gate length can be shortened, resulting in an improved transistor property (transconductance ($g_m$), gain).

The respective widths of the source electrode 13, drain electrode 14, gate electrode 16, gate recessed region 15, and depressed portion 18 and the relative positions thereof are as shown in FIGS. 1. The thickness of the conductive layer 11 is 100 nm. The depth of the gate recessed region 15 is 50 nm, while the depth of the depressed portion 18 is 25 nm.

Figure 2:
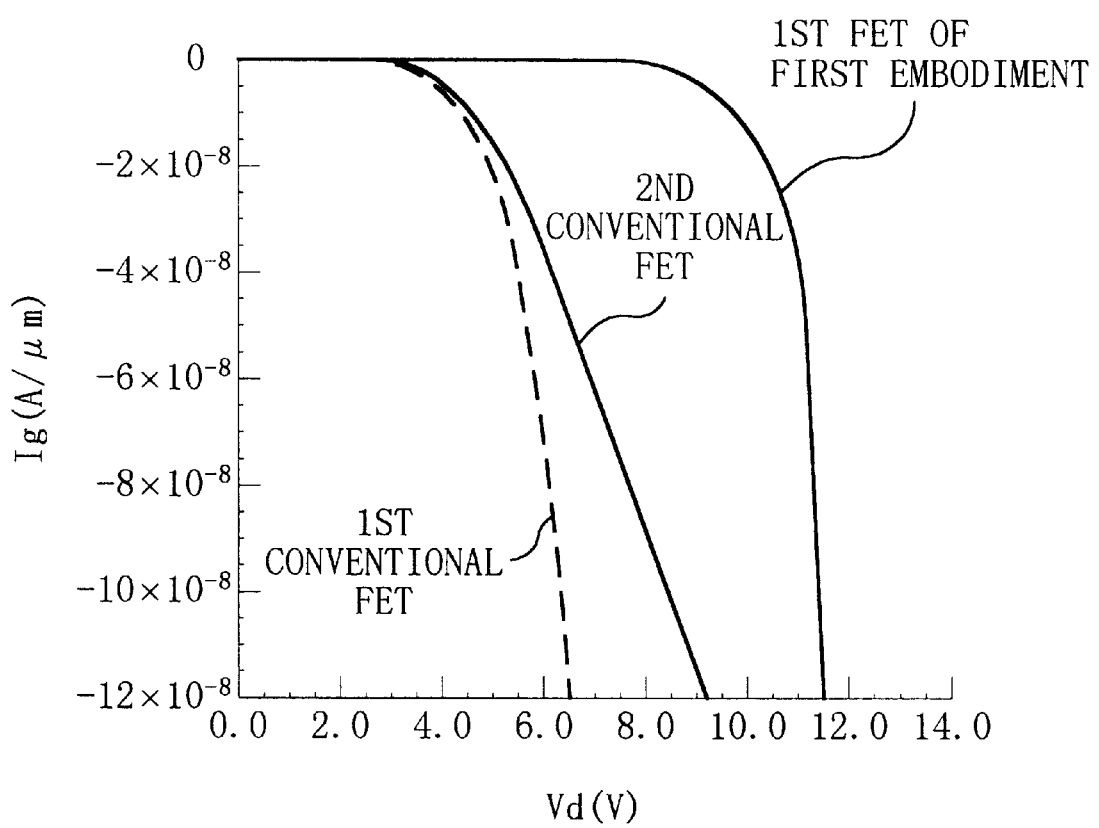
FIG. 2 is a graph showing the simulated voltage-resistant properties of the first FET according to the first embodiment and of the FETs according to the first and second conventional embodiments.
Figure 46:
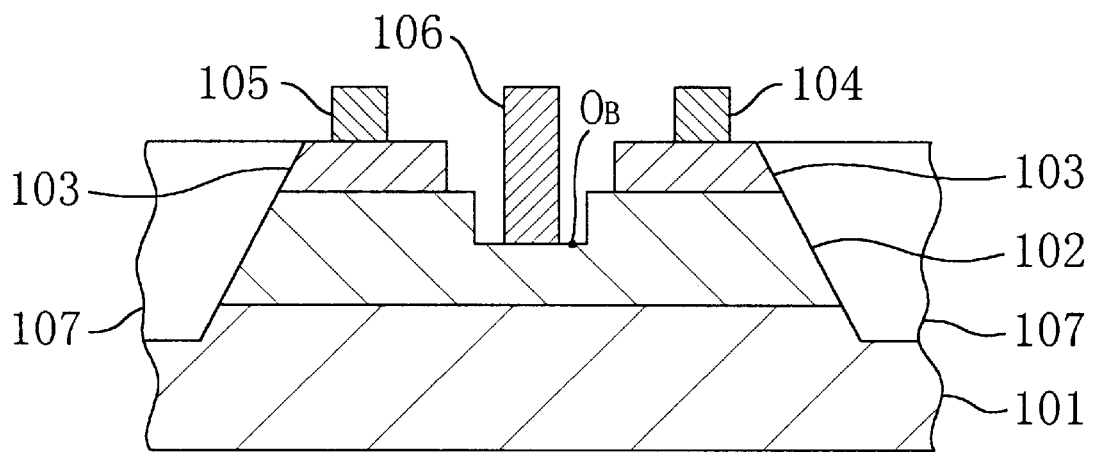
FIG. 46 is a cross-sectional view of the MESFET with the recessed gate structure according to the first conventional embodiment.
Figure 47:
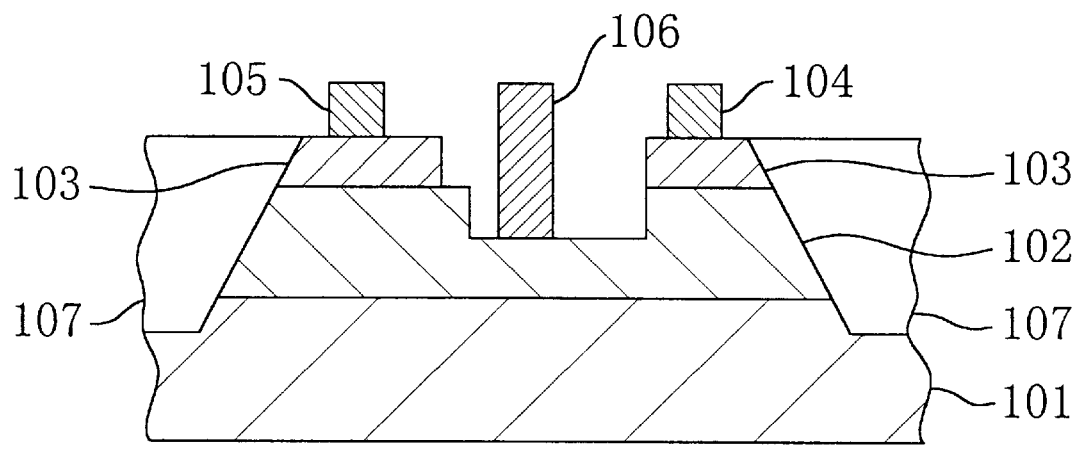
FIG. 47 is a cross-sectional view of the MESFET with the gate offset structure according to the second conventional embodiment.
Figure 48:
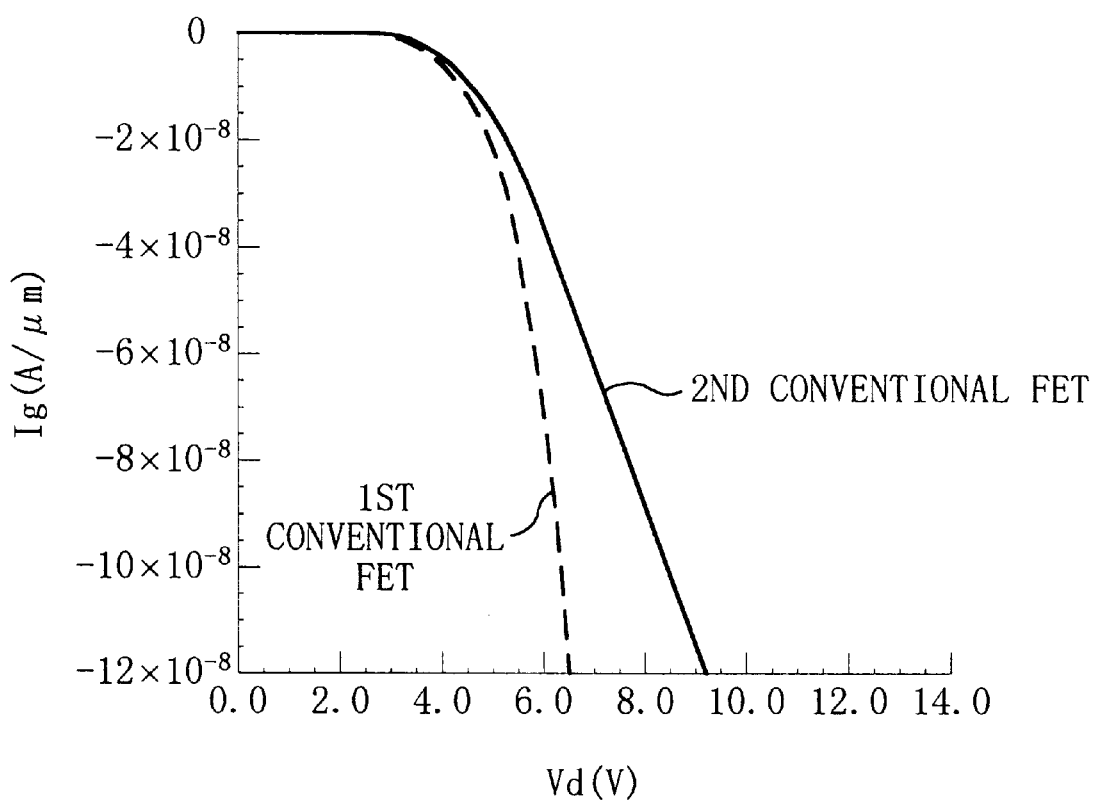
FIG. 48 shows the simulated gate-current-versus-drain-voltage characteristics of the FETs according to the first and second conventional embodiments.

FIG. 2 shows the result of simulating the respective voltage-resistant properties of the first FET according to the first embodiment, the FET according to the first conventional embodiment shown in FIG. 46, and the FET according to the second conventional embodiment shown in FIG. 47 by using a device simulator. The structure of the FET according to the first conventional embodiment is the same as that of the first FET except that the depressed portion 18 is not formed therein and that the width of the gate recessed region 15 is 1 $\mu$m. The structure of the FET according to the second conventional embodiment is the same as that of the first FET except that the depressed portion 18 is not formed therein. Simulation is performed by maintaining the source and gate voltages to 0 v, while varying the drain voltage. As is apparent from FIG. 2, the absolute value of a leakage current from the gate electrode is smaller in the first FET according to the first embodiment than in the FETs according to the first and second conventional embodiments, so that drain voltage resistance has been improved significantly in the first FET.

Figure 3:
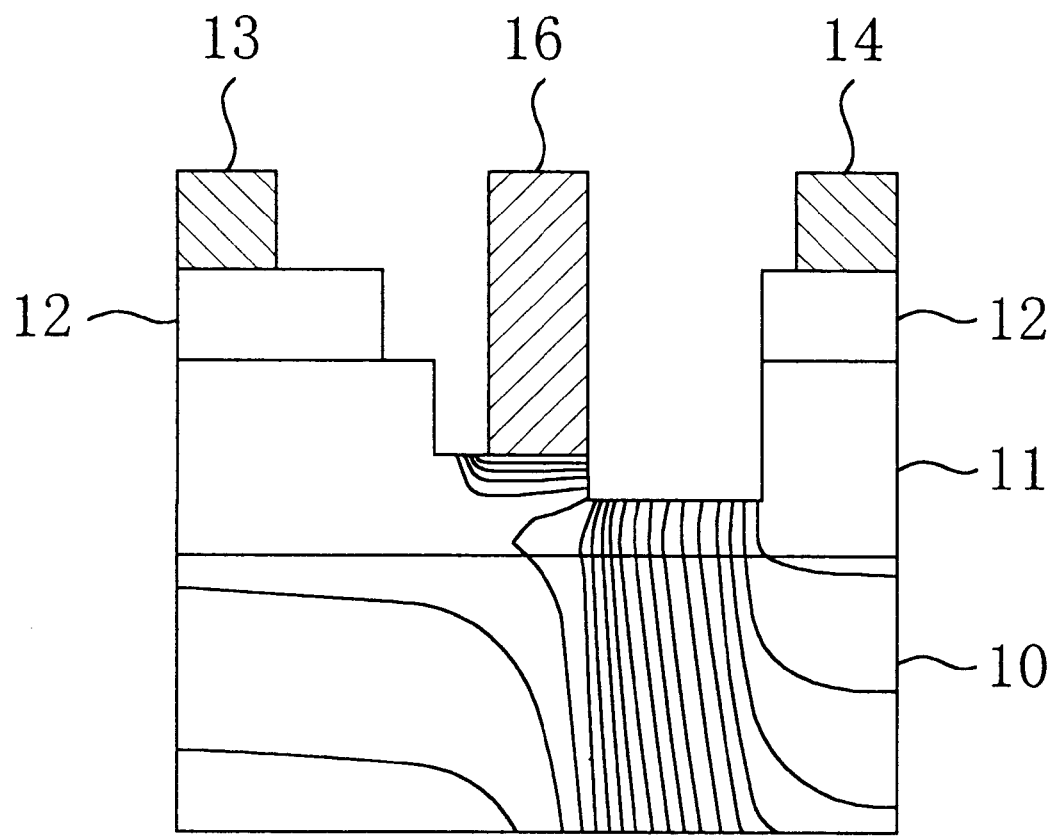
FIG. 3 shows the simulated distribution of equipotential lines in the first FET according to the first embodiment when the width of a depressed portion is 0.8 $\mu$m and a drain voltage is 7.5 v.

FIG. 3 shows the distribution of equipotential lines in the first FET according to the first embodiment, which is obtained by plotting points having the same potential in 0.05v steps (logarithmic representation) when the drain voltage is 7.5 v. In FIG. 3, the same bias conditions as used in FIGS. 49 and 50 are used.

Figure 49:
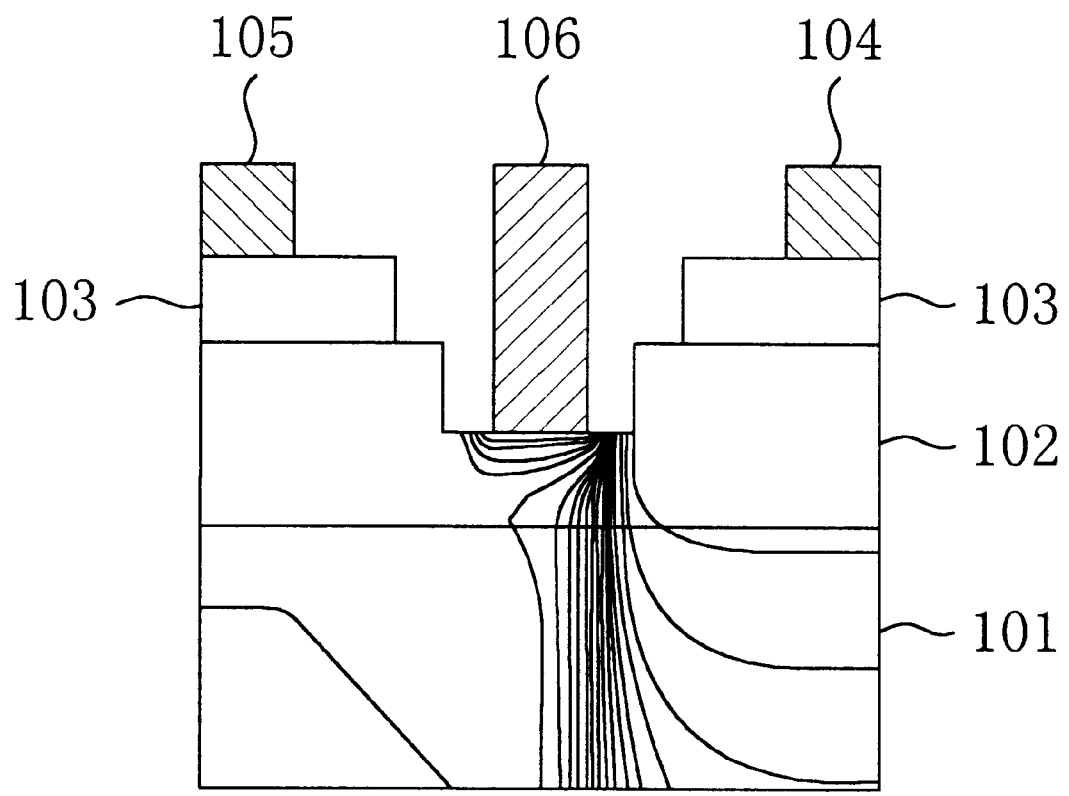
FIG. 49 shows the simulated distribution of equipotential lines in the FET according to the first conventional embodiment when a drain voltage is 7.5 v.
Figure 50:
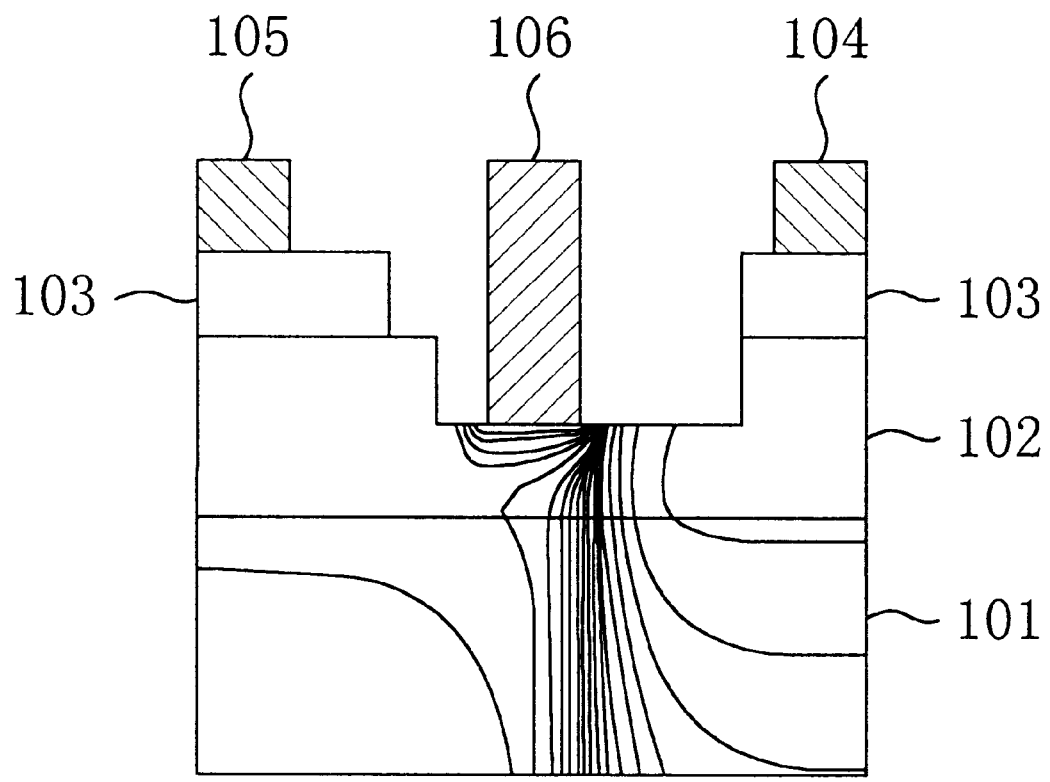
FIG. 50 shows the simulated distribution of equipotential lines in the FET according to the second conventional embodiment when a drain voltage is 7.5 v.

As is apparent from comparison among FIGS. 3, 49, and 50, the equipotential lines are sparsely distributed in the region of the conductive layer 11 underlying the depressed portion 18 in the first FET according to the first embodiment. Since the electric-field intensity is lower as the distribution of equipotential lines is more sparse, it will be understood that the electric-field intensity between the gate electrode 16 and the drain electrode 14 is lower in the first FET according to the first embodiment than in the FETs according to the first and second conventional embodiments.

Figure 4:
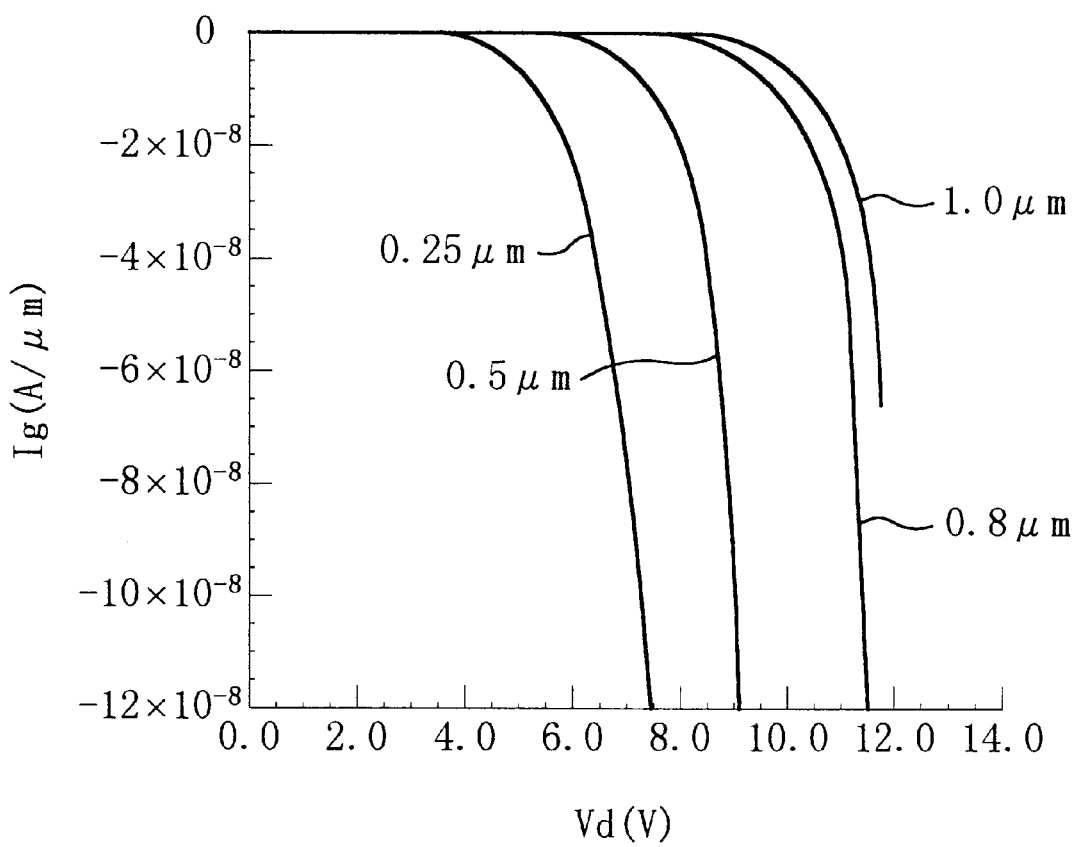
FIG. 4 is a graph showing the simulated gate-current-versus-drain-voltage characteristics of the first FET according to the first embodiment when the width of the depressed portion is varied.

FIG. 4 shows respective gate-current-versus-drain-voltage characteristics when the width of the depressed portion 18 in the first FET according to the first embodiment is 0.25 $\mu$m, 0.5$\mu$m, 0.8 $\mu$m, and 1.0 $\mu$m. As is apparent from FIG. 4, the absolute value of the leakage current from the gate electrode is smaller as the width of the depressed portion 18 is larger.

Figure 5:
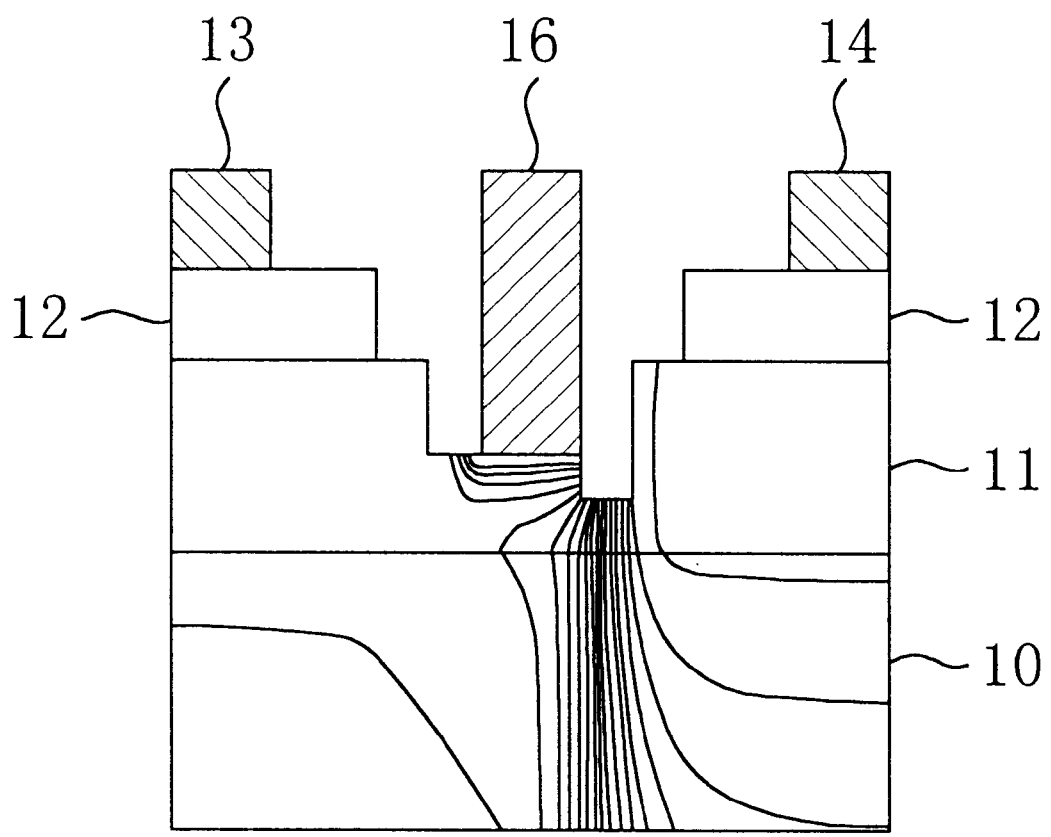
FIG. 5 shows the simulated distribution of equipotential lines in the first FET according to the first embodiment when the depth of the depressed portion is 0.25 $\mu$m and the drain voltage is 7.5 v.
Figure 6:
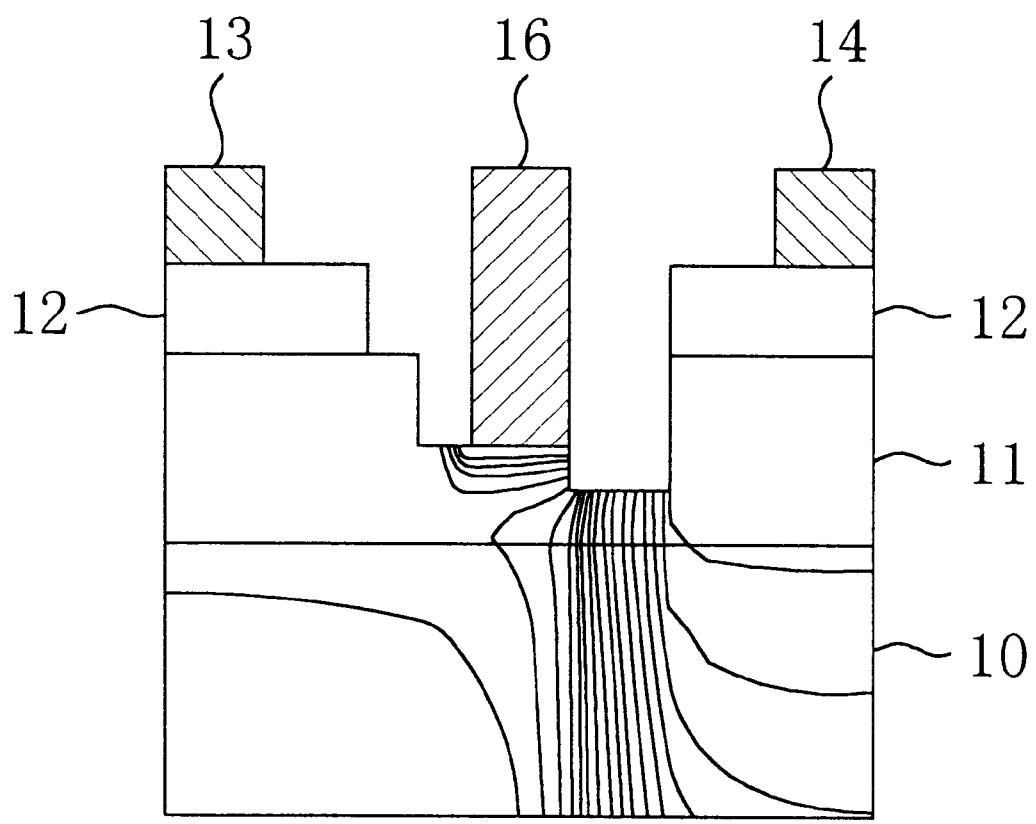
FIG. 6 shows the simulated distribution of equipotential lines in the first FET according to the first embodiment when the width of the depressed portion is 0.5 $\mu$m and the drain voltage is 7.5 v.
Figure 7:
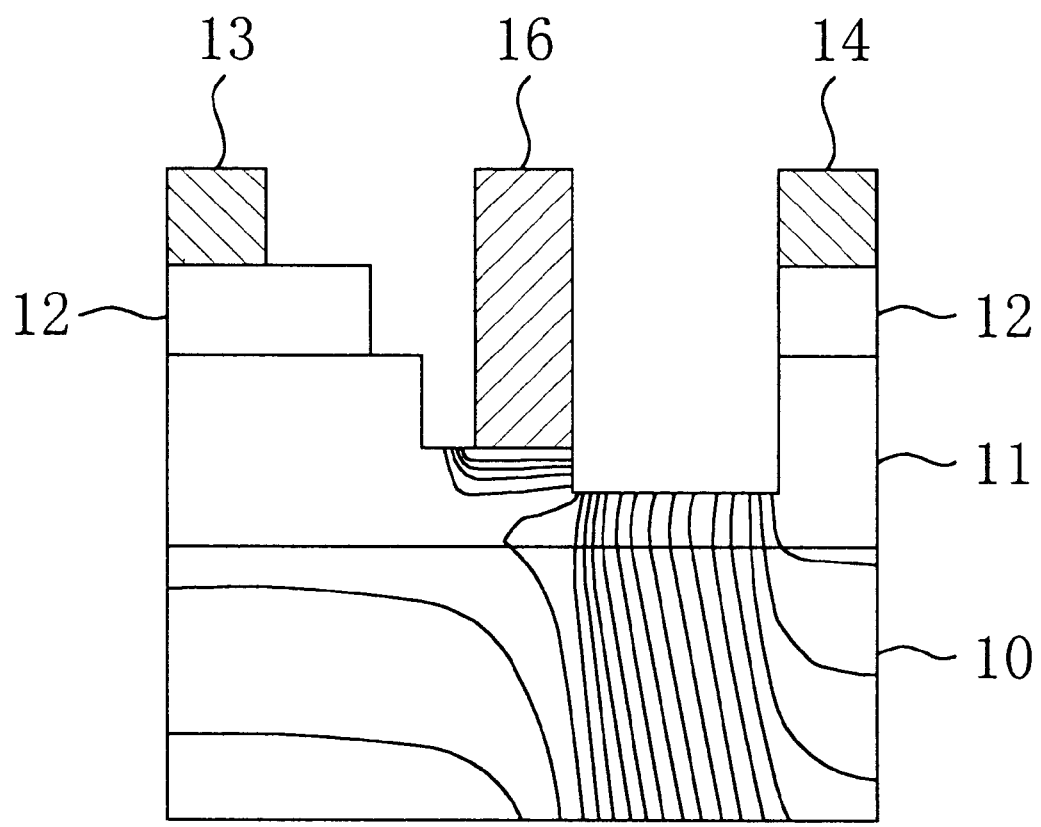
FIG. 7 shows the simulated distribution of equipotential lines in the first FET according to the first embodiment when the width of the depressed portion is 1.0 $\mu$m and the drain voltage is 7.5 v.

FIGS. 5, 6, and 7 show the distributions of equipotential lines when the width of the depressed portion 18 is 0.25 $\mu$m, 0.5 $\mu$m, and 1.0 $\mu$m, which are obtained by plotting points having the same potential in 0.05v steps (logarithmic representation) when the drain voltage is 7.5 v. As can be understood from comparison among FIGS. 3, 5, 6, and 7, the electric-field intensity is lower as the width of the depressed portion 18 is larger, resulting in improved drain voltage resistance.

Since the depressed portion 18 is formed in the region of the conductive layer 11 located between the gate electrode 16 and the drain electrode 14 in the first FET according to the first embodiment, the capacitance between the gate electrode 16 and the drain electrode 14 is reduced, resulting in increased power gain. In the first conventional embodiment shown in FIG. 46, e.g., the gate-to-drain capacitance per unit gate width of 1 $\mu$m is $0.13 \times 10^{-15}$ F/$\mu$m and bi-directional power gain is 20 dBm/$\mu$m when the drain voltage is 1 v. However, the result of simulation indicates that, in the first FET according to the first embodiment, the gate-to-drain capacitance per unit gate width of 1 $\mu$m is $0.08 \times 10^{-15}$ F/$\mu$m, which is half the gate-to-drain capacitance in the first conventional embodiment, and bi-directional power gain is as excellent as 23 dBm/$\mu$m when the drain voltage is 1 v.

Because the depressed portion 18 is formed in the region of the conductive layer 11 located between the gate electrode 16 and the drain electrode 14, an undesired reduction in the value of the drain current is expected in the first FET according to the first embodiment, but the result of simulation has proved no reduction in the value of the drain current even if the depressed portion 18 is formed. The value of the drain current obtained from the simulation is about $9 \times 10^{-5}$ A/$\mu$m.

Since a depletion layer has expanded in the region of the conductive layer 11 underlying the end portion of the gate electrode 16 closer to the drain electrode 14, the major portion of a current flows into the semi-insulating substrate 10. However, since the depressed portion 18 has been formed in the region of the conductive layer 11 through which a current seldom flows due to the expanded depletion layer, neither current nor mutual conductance is reduced significantly.

Figure 8A:
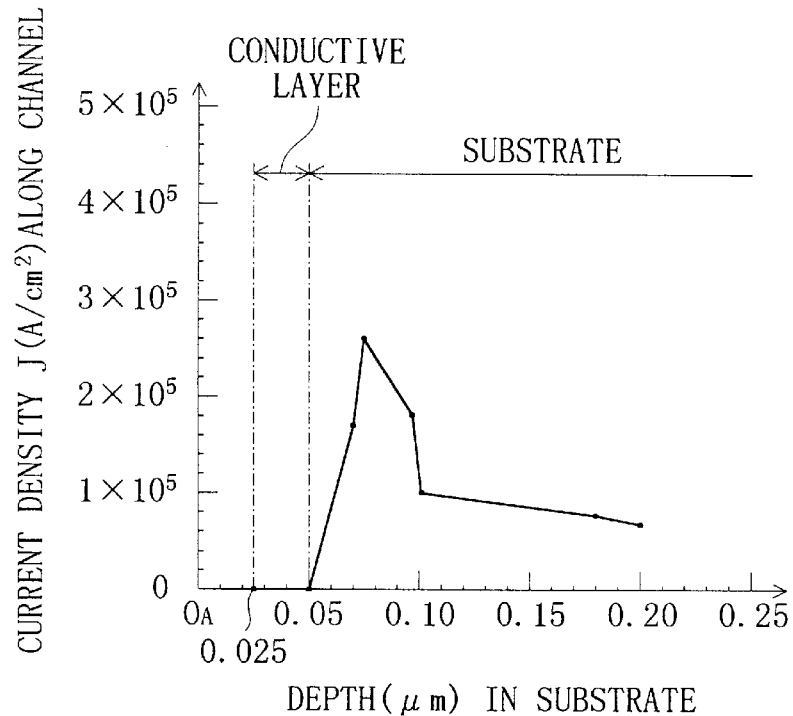
FIG. 8(a) shows a relationship between a depth in a semi-insulating substrate and a simulated current density in the substrate and conductive layer of the first FET according to the first embodiment and FIG. 8(b) shows a relationship therebetween in the substrate and conduct layer of the FET according to the first conventional embodiment.
Figure 8B:
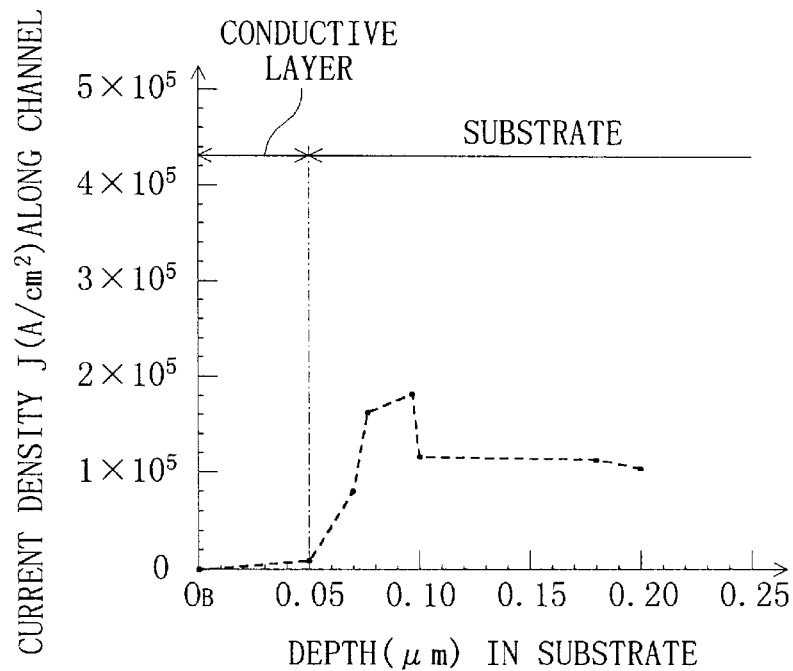

FIGS. 8(a) and 8(b) show current densities Jx (A/cm$^2$) in the semi-insulating substrate 10 and in the conductive layer 11, which have been plotted against a depth in the substrate represented by the x-axis. FIG. 8(a) shows the current densities in the first FET according to the first embodiment shown in FIGS. 1, in which the x-axis representing a depth in the substrate extends from $0_A$ as the starting point. FIG. 8(b) shows the current densities in the FET according to the first conventional embodiment shown in FIGS. 46, in which the x-axis representing a depth in the substrate extends from $0_B$ as the starting point. From FIGS. 8(a) and 8(b), it will be understood that the current densities are substantially unaffected by the depressed portion 18 formed in the conductive layer 11.

(Second FET of First Embodiment)

A second FET according to the first embodiment of the present invention will be described.

In contrast to the MESFET as the first FET having the gate electrode formed on the conductive layer, a MISFET as the second FET has a gate electrode formed on an undoped layer formed on a conductive layer.

Figure 9:
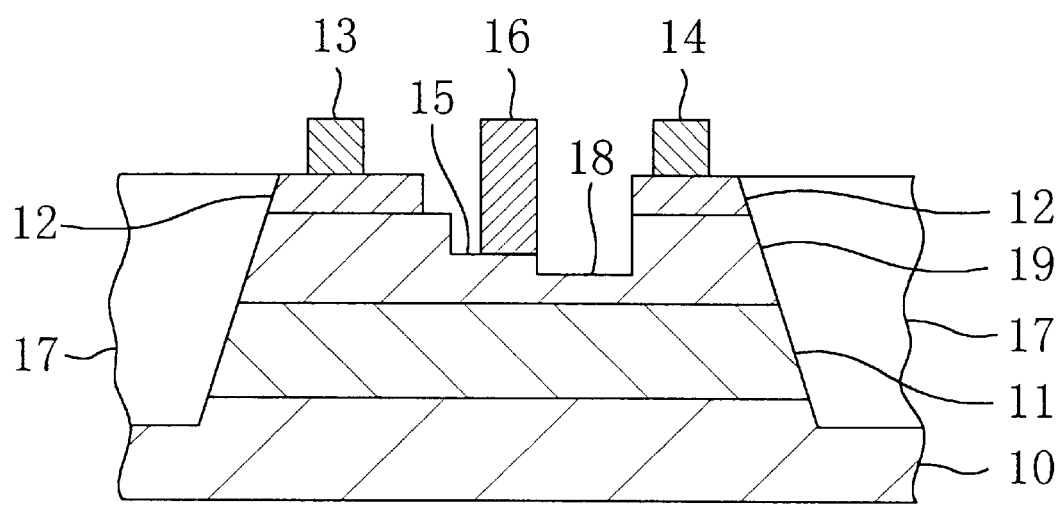
FIG. 9 is cross-sectional view of a MISFET as a second FET according to the first embodiment of the present invention.

FIG. 9 shows the cross-sectional structure of the MISFET as the second FET according to the first embodiment. As shown in the drawing, the conductive layer 11 made of GaAs doped with Si as an impurity is formed on a semiconductor substrate 10 made of GaAs. The undoped layer 19 as a semiconductor layer made of GaAs or AlGaAs undoped with an impurity is formed on the conductive layer 11. A pair of contact regions 12 made of n⁺-type GaAs heavily doped with Si as an impurity and having a given spacing therebetween are formed on the undoped layer 19. A source electrode 13 is formed on the contact region 12 on the source side, while a drain electrode 14 is formed on the contact region 12 on the drain side. The source electrode 13 and the drain electrode 14 are in ohmic contact with the respective contact regions 12.

A gate recessed region 15 is formed in the region of the undoped layer 19 located between the pair of contact regions 12 such that a gate electrode 16 is formed on the gate recessed region 15 to form a Schottky junction with the undoped layer 19. An element isolation region 17 is formed around the conductive layer 11, undoped layer 19, and contact regions 12.

The second FET according to the first embodiment is characterized in that a depressed portion 18 is formed in the gate recessed region 15 of the undoped layer 19. In this case, the wall face of the depressed portion 18 closer to the gate electrode 16 may be flush with or protruding from the side face of the gate electrode 16 facing the drain electrode 14.

Although the semiconductor layer is composed of the undoped layer 19 in the second FET according to the first embodiment, the semiconductor layer may also be composed of a lower undoped layer made of AlGaAs, an electron supplying layer made of n⁺-type AlGaAs, and an upper undoped layer made of GaAs. What results is a semiconductor layer with a quantum-well structure including a hetero junction. In this case, the depressed portion 18 may be formed only in the upper undoped layer or formed continuously in the upper undoped layer and in the electron supplying layer across the boundary thereof.

In the second FET also, equipotential lines are sparsely distributed in the region of the undoped layer 19 underlying the depressed portion 18, similarly to the first FET, so that the electric-field intensity between the gate electrode 16 and the drain electrode 14 is reduced, which improves drain voltage resistance.

Moreover, the depressed portion 18 is formed in the region of the undoped layer 19 located between the gate electrode 16 and the drain electrode 14, the capacitance between the gate electrode 16 and the drain electrode 14 is reduced, resulting in higher power gain.

(Third FET of First Embodiment)

A third FET according to the first embodiment of the present invention will be described.

In contrast to the second FET in which the depressed portion 18 is formed in the region of the undoped layer 19 located between the gate electrode 16 and the drain electrode 14, a plurality of depressed portions 18 are provided in the region of an undoped layer 19 located between the gate electrode 16 and the drain electrode 14 in the third FET.

Figure 10:
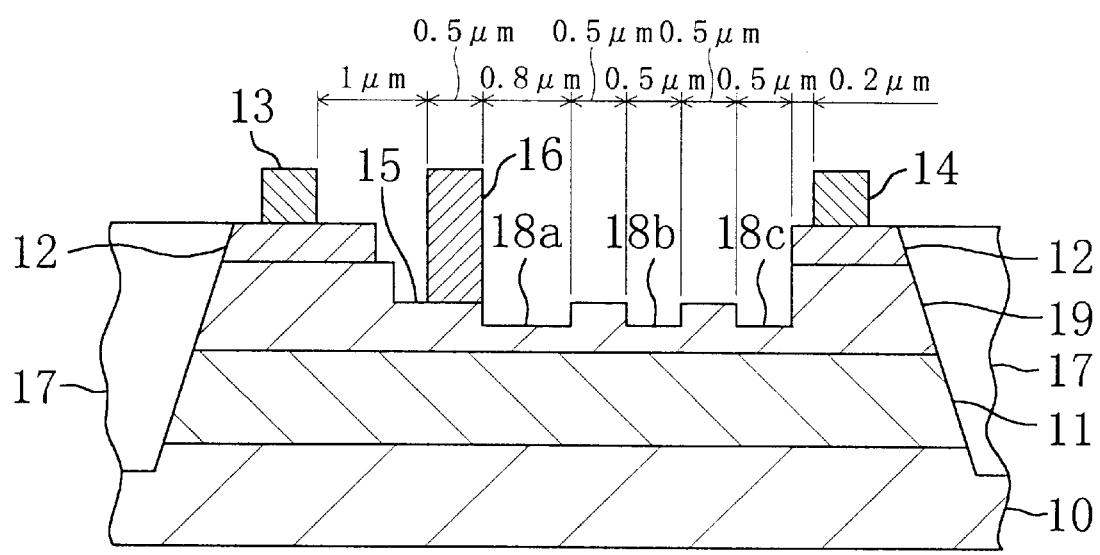
FIG. 10 is a cross-sectional view of a MISFET as a third FET according to the first embodiment of the present invention.

FIG. 10 shows the cross-sectional structure of a MISFET as the third FET according to the first embodiment. As shown in the drawing, a conductive layer 11 is formed on a semi-insulating substrate 10, the undoped layer 19 as the semiconductor layer is formed on the conductive layer 11, and a pair of contact regions 12 having a given spacing therebetween are formed on the undoped layer 19, similarly to the second FET. A source electrode 13 is formed on the contact region 12 on the source side, while a drain electrode 14 is formed on the contact region 12 on the drain side. The source electrode 13 and the drain electrode 14 are in ohmic contact with the respective contact regions 12. A gate recessed region 15 is formed in the region of the undoped layer 19 located between the pair of contact regions 12 so that a gate electrode 16 is formed on the gate recessed region 15 to form a Schottky junction with the undoped layer 19. An element isolation region 17 is formed around the conductive layer 11, the undoped layer 19, and the contact regions 12.

The third FET according to the first embodiment is characterized in that a plurality of depressed portions, e.g., three depressed portions 18a, 18b, and 18c are formed in the gate recessed region 15 of the undoped layer 19. The respective widths of the source electrode 13, drain electrode 14, gate electrode 16, gate recessed region 15, and depressed portions 18a, 18b, and 18c and the relative positions thereof are as shown in FIG. 10.

With the three depressed portions 18a, 18b, and 18c formed in the gate recessed region 15, equipotential lines are initially distributed in the region of the undoped layer 19 underlying the depressed portion 18a closer to the gate electrode. As the drain voltage is increased, however, equipotential lines are also distributed in the regions of the undoped layer 19 underlying the depressed portions 18b and 18c closer to the drain electrode, so that the electric field is also distributed due to the three depressed portions 18a, 18b, and 18c. Consequently, the electric-field intensity in the region of the undoped layer 19 underlying the depression 18a closer to the gate electrode is reduced. Thus, the formation of the three depressed portions 18a, 18b, and 18c increases drain voltage resistance compared with the case where only one depressed portion 18 is formed.

(Fourth FET of First Embodiment)

A fourth FET according to the first embodiment of the present invention will be described.

In contrast to the first FET in which the conductive layer 11 and the contact regions 12 are formed by crystal growth, a conductive layer 11 and contact regions 12 are formed by ion implantation in the fourth FET.

Figure 11:
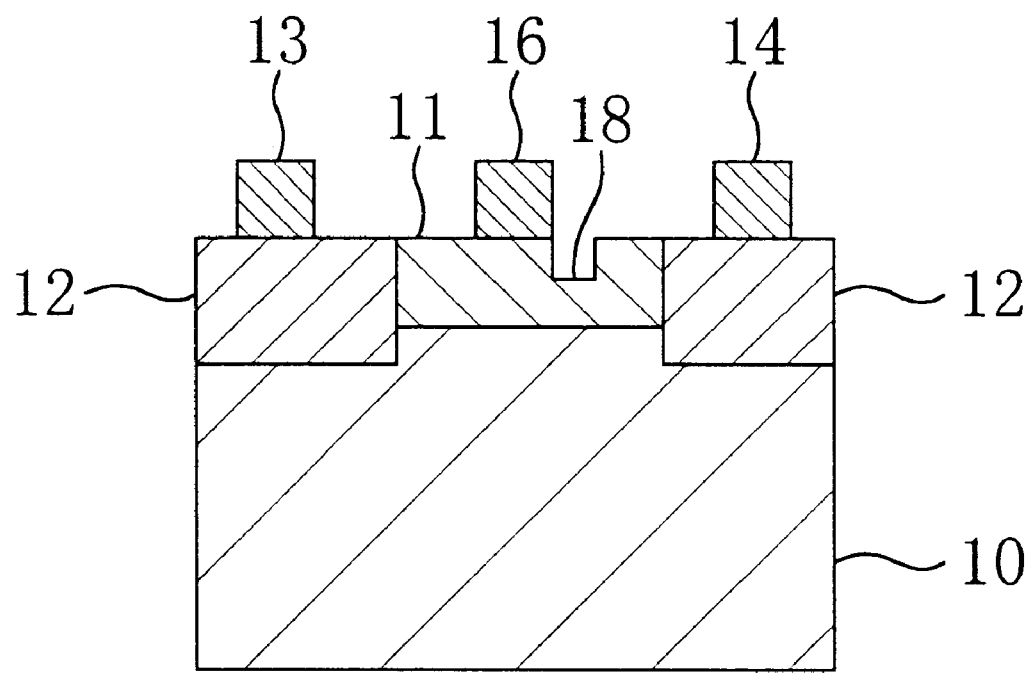
FIG. 11 is a cross-sectional view of a MESFET as a fourth FET according to the first embodiment of the present invention.

FIG. 11 shows the cross-sectional structure of a MESFET as the fourth FET according to the first embodiment. As shown in the drawing, the conductive layer 11 made of n-type GaAs doped with Si as an impurity is formed on the central portion of a semi-insulating substrate 10 made of GaAs. A pair of contact regions 12 made of n⁺-type GaAs heavily doped with Si as an impurity are formed on both sides of the conductive layer 11 in the semi-insulating substrate 10. A source electrode 13 is formed on the left-hand contact region 12, while a drain electrode 14 is formed on the right-hand contact region 12. The source electrode 13 and the drain electrode 14 are in ohmic contact with the respective contact regions 12. A gate electrode 16 is formed on the conductive layer 11 to form a Schottky junction therewith.

The fourth FET according to the first embodiment is characterized in that a depressed portion 18 is formed in the region of the conductive layer 11 located between the gate electrode 16 and the drain electrode 14. In this case, the wall face of the depressed portion 18 closer to the gate electrode 16 may be flush with or protruding from the side face of the gate electrode 16 facing the drain electrode 14.

In the fourth FET also, equipotential lines are sparsely distributed in the region of the conductive layer 11 underlying the depressed portion 18, similarly to the first FET, so that the electric-field intensity between the gate electrode 16 and the drain electrode 14 is reduced, which improves drain voltage resistance.

Moreover, since the depressed portion 18 is formed in the region of the conductive layer 11 located between the gate electrode 16 and the drain electrode 14, the capacitance between the gate electrode 16 and the drain electrode 14 is reduced, resulting in higher power gain. Although the depressed portion 18 is formed only in the conductive layer 11 in the fourth FET according to the first embodiment, the depressed portion 18 may be formed continuously in the conductive layer 11 and in the contact region 12 on the drain side across the boundary thereof.

Because the depressed portion 18 is formed in the region of the conductive layer 11 or semiconductor layer located between the gate electrode 16 and the drain electrode 14, an undesired reduction in the value of the drain current is expected in the first to fourth FETs according to the first embodiment, but the result of simulation has proved no reduction in the value of the drain current even if the depressed portion 18 is formed.

(First FET of Second Embodiment)

A first FET according to a second embodiment of the present invention will be described.

Figure 12:
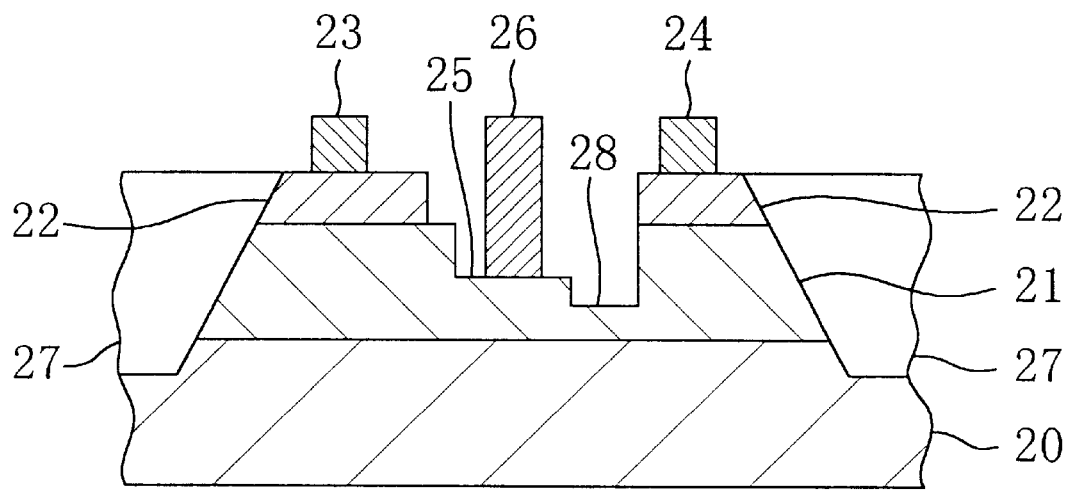
FIG. 12 is a cross-sectional view of a MESFET as a first FET according to a second embodiment of the present invention.

FIG. 12 shows the cross-sectional structure of a MESFET as the first FET according to the second embodiment. As shown in the drawing, a conductive layer 21 made of n-type GaAs doped with Si as an impurity is formed on a semi-insulating film 20 made of GaAs. A pair of contact regions 22 made of $n^+$-type GaAs heavily doped with Si as an impurity and having a given spacing therebetween are formed on the conductive layer 21. In this case, the conductive layer 21 and the contact regions 22 are formed by crystal growth. A source electrode 23 composed of a vapor deposited layer of AuGe or the like is formed on the contact region 22 on the source side, while a drain electrode 24 composed of a vapor deposited layer of AuGe or the like is formed on the contact region 22 on the drain side. The source electrode 23 and the drain electrode 24 are in ohmic contact with the respective contact regions 22. A gate recessed region 25 is formed in the region of the conductive layer 21 located between the pair of contact regions 22 so that a gate electrode 26 is formed on the gate recessed region 25 to form a Schottky junction with the conductive layer 21. An element isolation region 27 is formed around the conductive layer 21 and the contact regions 22.

The first FET according to the second embodiment is characterized in that a depressed portion 28 is formed by etching in the gate recessed region 25 of the conductive layer 21. The depth of the depressed portion 28 is half the depth of the gate recessed region 25 of the conductive layer 21. In the gate recessed region 25, a given spacing is provided between the wall face of the depressed portion 28 closer to the gate electrode 26 and the side face of the gate electrode 26 facing the drain electrode 24.

In the first FET according to the second embodiment, since a given spacing is provided between the wall face of the depressed portion 28 closer to the gate electrode 26 and the side face of the gate electrode 26 facing the drain electrode 24, equipotential lines are distributed in the region of the undoped layer 29 underlying the side face of the gate electrode facing the drain electrode and in the region of the undoped layer 29 underlying the depressed portion 28, resulting in reduced electric-field intensity and further improved drain voltage resistance.

Figure 13:
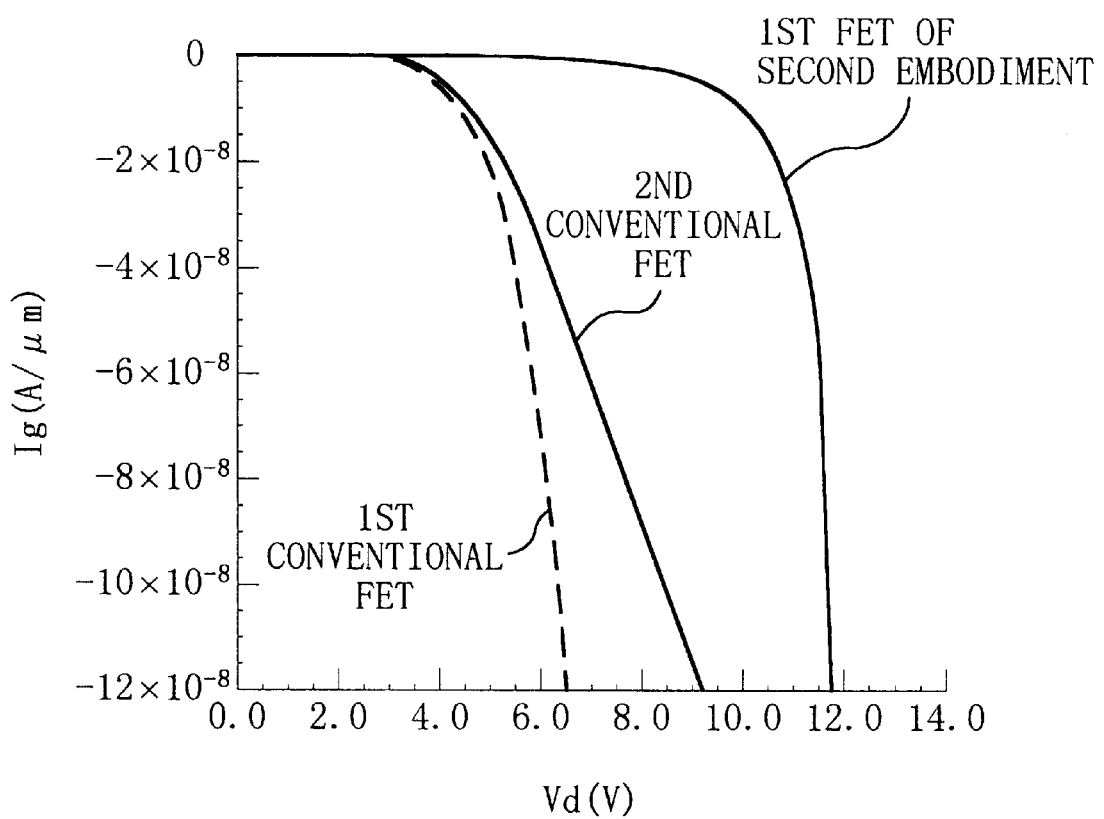
FIG. 13 shows the simulated voltage-resistant properties of the first FET according to the second embodiment of the present invention and of the FETs according to the first and second conventional embodiments.

FIG. 13 shows the result of simulating the respective voltage-resistant properties of the first FET according to the second embodiment, the FET according to the first conventional embodiment shown in FIG. 46, and the FET according to the second conventional embodiment shown in FIG. 47 by using a device simulator. Simulation is performed by maintaining the source and gate voltages to 0 v, while varying the drain voltage. As is apparent from FIG. 13, the absolute value of a leakage current from the gate electrode is smaller in the first FET according to the second embodiment than in the FETs according to the first and second conventional embodiments, so that drain voltage resistance has been improved significantly in the first FET.

Figure 14:
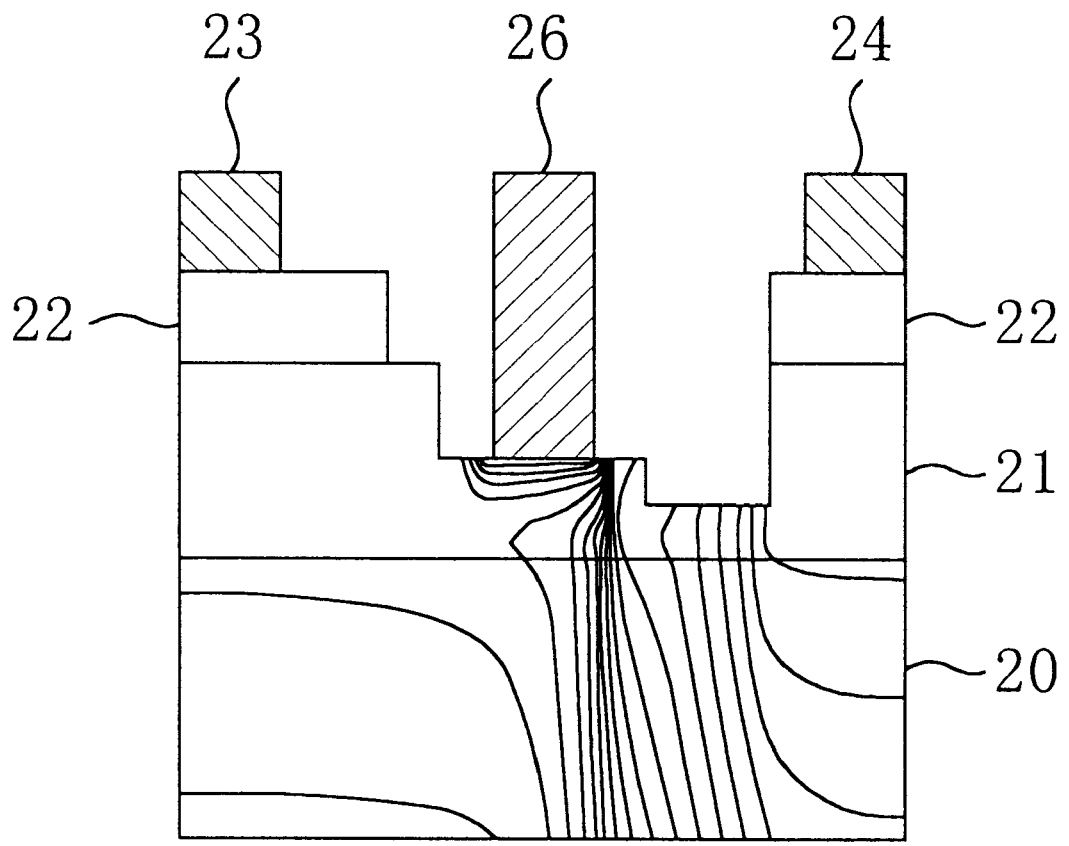
FIG. 14 shows the simulated distribution of equipotential lines in the first FET according to the second embodiment when a drain voltage is 7.5 v.

FIG. 14 shows the distribution of equipotential lines in the first FET according to the second embodiment, which is obtained by plotting points having the same potential in 0.05v steps (logarithmic representation) when the drain voltage is 7.5 v. In FIG. 14, the same bias conditions as used in FIGS. 49 and 50 are used.

As is apparent from comparison among FIGS. 14, 49, and 50, the equipotential lines are sparsely distributed in the region of the conductive layer 21 underlying the depressed portion 28 in the first FET according to the second embodiment. Since the electric-field intensity is lower as the distribution of equipotential lines is more sparse, it will be understood that the electric-field intensity between the gate electrode 26 and the drain electrode 24 is lower in the first FET according to the second embodiment than in the FETs according to the first and second conventional embodiments. As a result, drain voltage resistance is increased in the first FET according to the second embodiment.

(Second FET of Second Embodiment)

A second FET according to the second embodiment of the present invention will be described.

In contrast to the MESFET as the first FET having the gate electrode formed on the conductive layer, an undoped layer is formed on a conductive layer and a gate electrode is formed on the undoped layer in a MISFET as the second FET according to the second embodiment.

Figure 15:
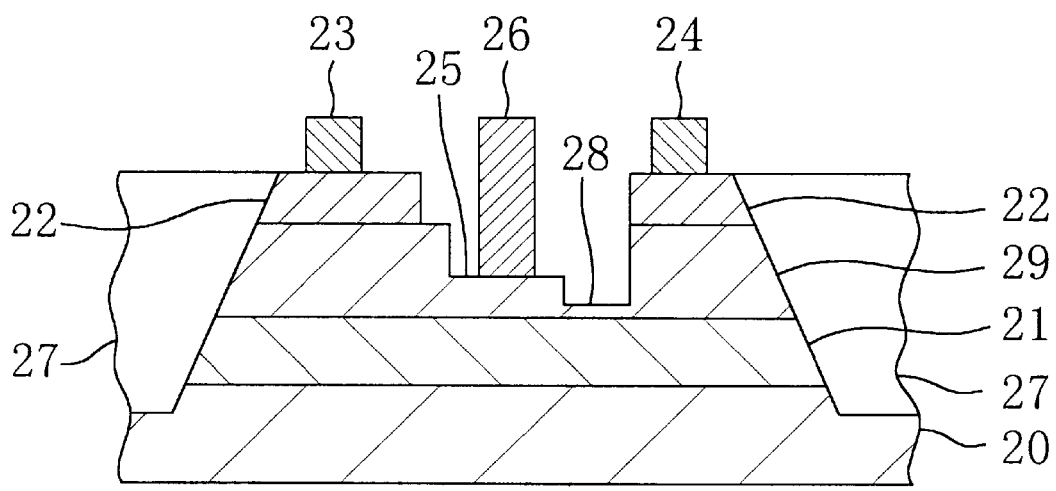
FIG. 15 is a cross-sectional view of a MISFET as a second FET according to the second embodiment of the present invention.

FIG. 15 shows the cross-sectional structure of the MISFET as the second FET according to the second embodiment. As shown in the drawing, the conductive layer 21 made of n-type GaAs doped with Si as an impurity is formed on a semi-insulating substrate 20 made of GaAs. The undoped layer 29 as a semiconductor layer made of GaAs or AlGaAs undoped with an impurity is formed on the conductive layer 21. A pair of contact regions 22 made of $n^+$-type GaAs heavily doped with Si as an impurity and having a given spacing therebetween are formed on the undoped layer 29. A source electrode 23 is formed on the left-hand contact region 22, while a drain electrode 24 is formed on the right-hand contact region 22. The source electrode 23 and the drain electrode 24 are in ohmic contact with the respective contact regions 22.

A gate recessed region 25 is formed in the region of the undoped layer 29 located between the pair of contact regions 22 so that a gate electrode 26 is formed on the gate recessed region 25 to form a Schottky junction with the undoped layer 29. An element isolation region 27 is formed around the conductive layer 21, the undoped layer 29, and the contact regions 22.

The second FET according to the second embodiment is characterized in that a depressed portion 28 is formed in the gate recessed region 25 of the undoped layer 29 and that a given spacing is provided between the wall face of the depressed portion 28 closer to the gate electrode 26 and the side face of the gate electrode 26 facing the drain electrode 24. As a result, drain voltage resistance is further improved, similarly to the first FET.

Although the semiconductor layer is composed of the undoped layer 29 in the second FET according to the second embodiment, the semiconductor layer may also be composed of a lower undoped layer made of AlGaAs, an electron supplying layer made of n$^+$-type AlGaAs, and an upper undoped layer made of GaAs. What results is a semiconductor layer with a quantum-well structure including a hetero junction. In this case, the depressed portion 28 may be formed only in the upper undoped layer or formed continuously in the upper undoped layer and in the electron supplying layer across the boundary thereof.

(Third FET of Second Embodiment)

A third FET according to the second embodiment of the present invention will be described.

In contrast to the first FET in which the conductive layer 21 and the contact regions 22 are formed by crystal growth, a conductive layer 21 and contact regions 22 are formed by ion implantation in the third FET.

Figure 16:
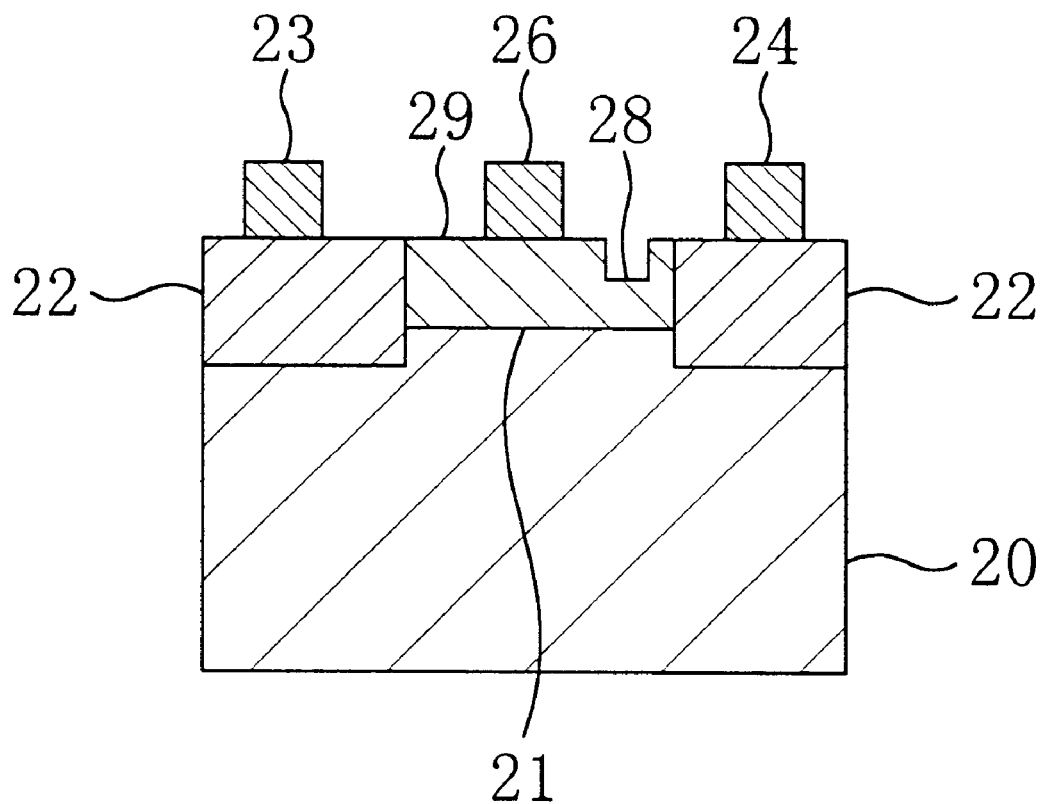
FIG. 16 is a cross-sectional view of a MESFET as a third FET according to the second embodiment of the present invention.

FIG. 16 shows the cross-sectional structure of a MESFET as the third FET according to the second embodiment. As shown in the drawing, the conductive layer 21 made of n-type GaAs doped with Si as an impurity is formed in the central portion of a semi-insulating substrate 20 made of GaAs. The pair of contact regions 22 made of n$^+$-type GaAs heavily doped with Si as an impurity are formed on both sides of the conductive layer 21 in the semi-insulating substrate 20. A source electrode 23 is formed on the contact region 22 on the source side, while a drain electrode 24 is formed on the contact region 22 on the drain side. The source electrode 23 and the drain electrode 24 are in ohmic contact with the respective contact regions 22. A gate electrode 26 is formed on the conductive layer 21 to form a Schottky junction therewith.

The third FET according to the second embodiment is characterized in that a depressed portion 28 is formed in the region of the conductive layer 21 located between the gate electrode 26 and the drain electrode 24. A given spacing is provided between the wall face of the depressed portion 28 closer to the gate electrode 26 and the side face of the gate electrode 26 closer to the drain electrode 24.

Thus, in the third FET, the depressed portion 28 is formed in the region of the conductive layer 21 located between the gate electrode 26 and the drain electrode 24, while the given spacing is provided between the wall face of the depressed portion 28 closer to the gate electrode 26 and the side face of the gate electrode 26 facing the drain electrode 24, so that drain voltage resistance is further improved, similarly to the first FET.

Although the depressed portion 28 is formed only in the conductive layer 21 in the third FET according to the second embodiment, the depressed portion 28 may be formed continuously in the conductive layer 21 and in the contact region 22 on the drain side across the boundary thereof.

Because the depressed portion 28 is formed in the region of the conductive layer 21 or semiconductor layer located between the gate electrode 26 and the drain electrode 24, an undesired reduction in the value of the drain current is expected in the first to third FETs according to the second embodiment, but the result of simulation has proved no reduction in the value of the drain current even if the depressed portion 28 is formed.

(First FET of Third Embodiment)

A first FET according to a third embodiment of the present invention will be described.

Figure 17:
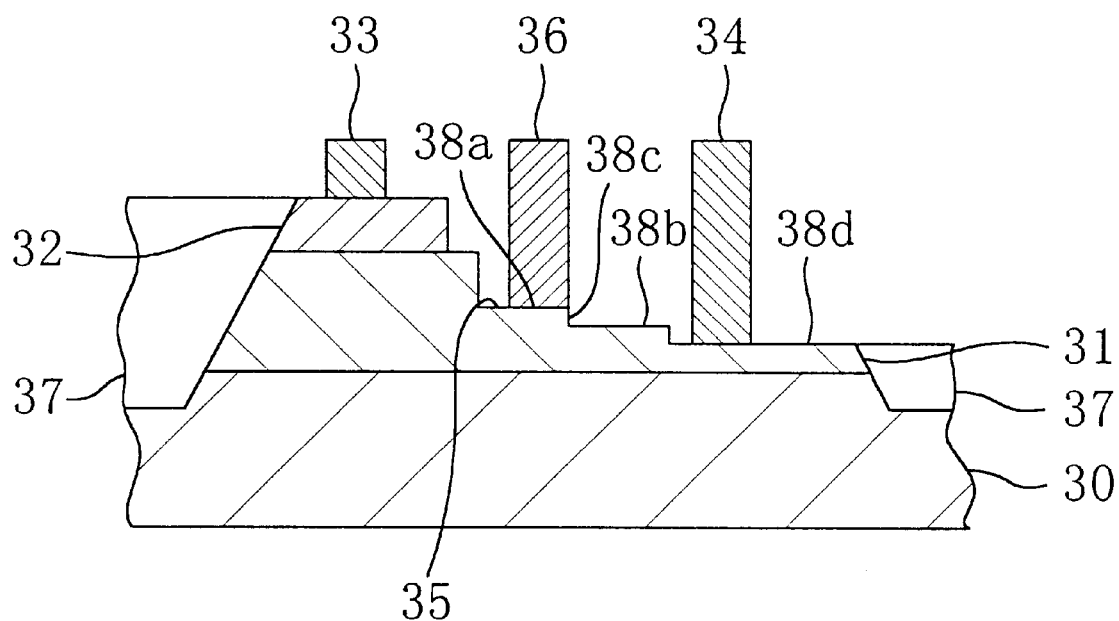
FIG. 17 is a cross-sectional view of a MESFET as a first FET according to a third embodiment of the present invention.

FIG. 17 shows the cross-sectional structure of a MESFET as the first FET according to the third embodiment. As shown in the drawing, a conductive layer 31 made of n-type GaAs doped with Si as an impurity is formed on a semi-insulating substrate 30 made of GaAs. A contact region 32 made of n$^+$-type GaAs heavily doped with Si as an impurity is formed on the source-side region of the conductive layer 31. A source electrode 33 composed of a vapor deposited layer of AuGe or the like is formed on the contact region 32 on the source side. In this case, the conductive layer 31 and the contact region 32 are formed by crystal growth. The source electrode 33 is in ohmic contact with the contact region 32. A gate recessed region 35 is formed in the conductive layer 31 so that a gate electrode 36 is formed on the gate recessed region 35 to form a Schottky junction with the conductive layer 31. An element isolation region 37 is formed around the conductive layer 31 and the contact region 32.

The first FET according to the third embodiment is characterized in that first and second steps are formed in the gate recessed region 35 of the conductive layer 31. Each of the first and second steps has a depth half the depth of the gate recessed region 35. The first step has an upper portion 38a, a lower portion 38b, and a vertical portion 38c, while the second step has an upper portion 38b and a lower portion 38d. The upper portion 38a of the first step is at the same level as the gate recessed region 35. The lower portion 38b of the first step corresponds to the upper portion 38b of the second step. In this case, the side face of the gate electrode 36 facing the drain electrode 34 may be flush with or protruding from the vertical portion 38c of the first step. A drain electrode 34 is formed on the lower portion 38d of the second step to be in ohmic contact with the conductive layer 31.

Figure 18:
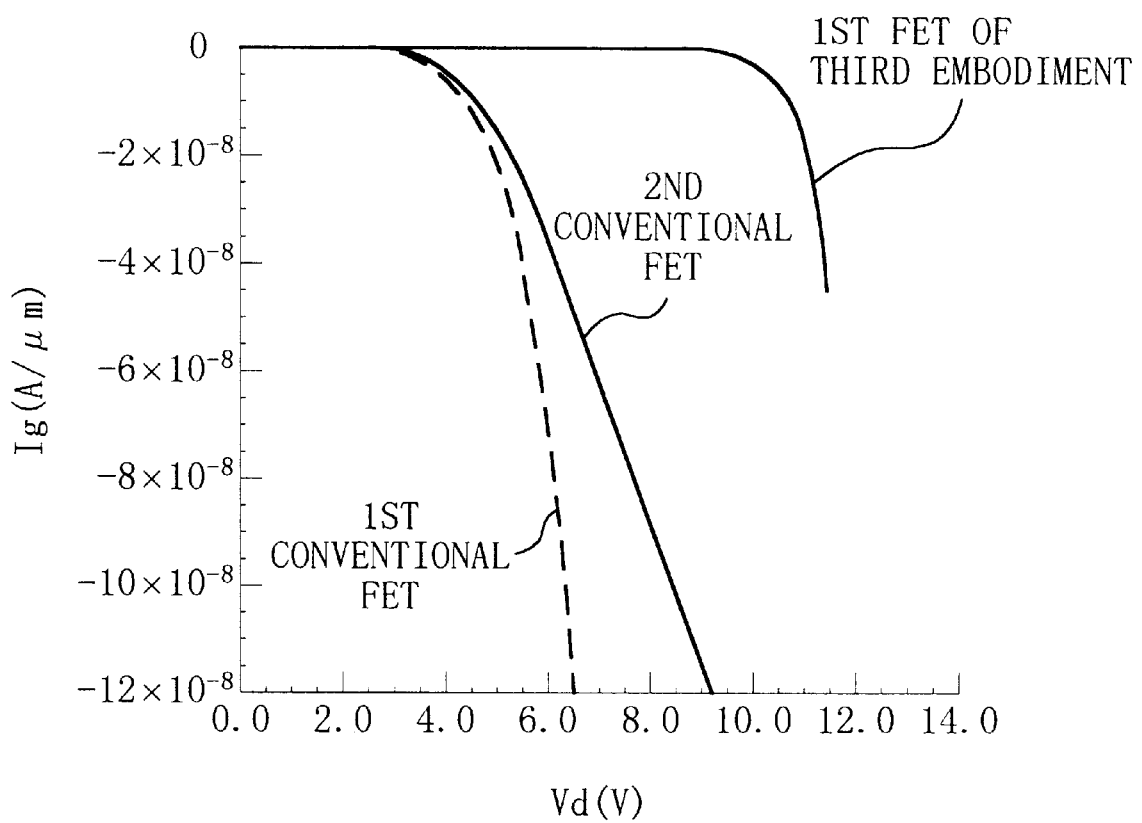
FIG. 18 shows the simulated voltage-resistant properties of the first FET according to the third embodiment and of the FETs according to the first and second conventional embodiments.

FIG. 18 shows the result of simulating the respective voltage-resistant properties of the first FET according to the third embodiment, the FET according to the first conventional embodiment shown in FIG. 46, and the FET according to the second conventional embodiment shown in FIG. 47 by using a device simulator. Simulation is performed by maintaining the source and gate voltages to 0 v, while varying the drain voltage. As is apparent from FIG. 18, the absolute value of a leakage current from the gate electrode is smaller in the first FET according to the third embodiment than in the FETs according to the first and second conventional embodiments, so that drain voltage resistance has been improved significantly in the first FET.

Figure 19:
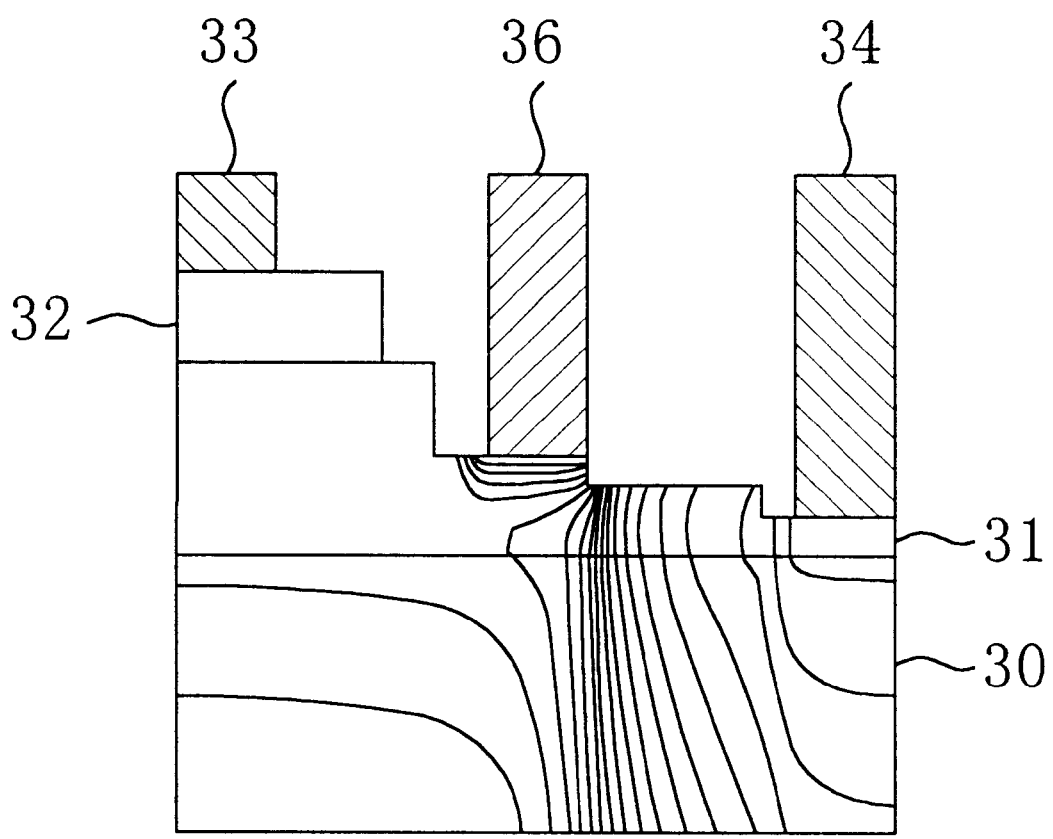
FIG. 19 shows the simulated distribution of equipotential lines in the first FET according to the third embodiment.

FIG. 19 shows the distribution of equipotential lines in the first FET according to the third embodiment, which is obtained by plotting points having the same potential in 0.05v steps (logarithmic representation) when the drain voltage is 7.5 v. In FIG. 19, the same bias conditions as used in FIGS. 49 and 50 are used.

As is apparent from comparison among FIGS. 19, 49, and 50, the equipotential lines are sparsely distributed in the lower portion 38b of the first step formed in the conductive layer 31 in the first FET according to the third embodiment. Since the electric-field intensity is lower as the distribution of equipotential lines is more sparse, it will be understood that the electric-field intensity between the gate electrode 36 and the drain electrode 34 is lower in the first FET according to the third embodiment than in the FETs according to the first and second conventional embodiments. As a result, drain voltage resistance is improved in the first FET according to the third embodiment.

Moreover, since the first step is formed in the region of the conductive layer 31 located between the gate electrode 36 and the drain electrode 34, the capacitance between the gate electrode 36 and the drain electrode 34 is reduced, resulting in higher power gain.

(Second FET of Third Embodiment)

A second FET according to the third embodiment of the present invention will be described.

In contrast to the MESFET as the first FET having the gate electrode formed on the conductive layer, a gate electrode is formed on an undoped layer formed on a conductive layer in a MISFET as the second FET.

Figure 20:
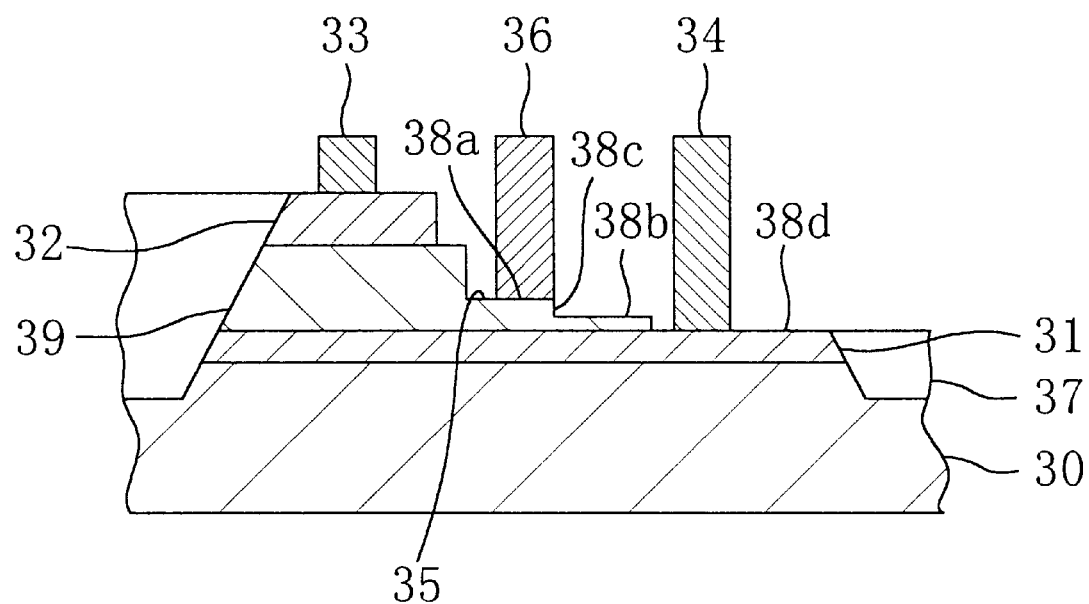
FIG. 20 is a cross-sectional view of a MISFET as a second FET according to the third embodiment.

FIG. 20 shows the cross-sectional structure of the second FET according to the third embodiment of the present invention. As shown in FIG. 20, the conductive layer 31 made of n-type GaAs doped with Si as an impurity is formed on a semi-insulating substrate 30 made of GaAs. An undoped layer 39 as a semiconductor layer made of GaAs or AlGaAs undoped with an impurity is formed on the conductive layer 31. A contact region 32 made of $n^+$-type GaAs heavily doped with Si as an impurity is formed on the source-side region of the undoped layer 39. A source electrode 33 is formed on the contact region 32 on the source side. In this case, the conductive layer 31 and the contact region 32 are formed by crystal growth. The source electrode 33 is in ohmic contact with the contact region 32. A gate recessed region 35 is formed in the conductive layer 31 so that a gate electrode 36 is formed on the gate recessed region 35 to form a Schottky junction with the conductive layer 31. An element isolation region 37 is formed around the conductive layer 31 and the contact region 32.

The second FET according to the third embodiment is characterized in that first and second steps are formed in the gate recessed region 35 of the conductive layer 31. Each of the first and second steps has a height half the height of the gate recessed region 35. The first step has an upper portion 38a, a lower portion 38b, and a vertical portion 38c, while the second step has an upper portion 38b and a lower portion 38d. The upper portion 38a of the first step is at the same level as the gate recessed region 35. The lower portion 38b of the first step corresponds to the upper portion 38b of the second step. In this case, the side face of the gate electrode 36 facing the drain electrode 34 may be flush with or protruding from the vertical portion 38c of the first step. The lower portion 38d of the second step is at the same level as the top face of he conductive layer 31. A drain electrode 34 is formed on the lower portion 38d of the second step, i.e., on the top face of the conductive layer 31 to be in ohmic contact therewith.

Thus, in the second FET according to the third embodiment, the first and second steps are formed in the region of the conductive layer 31 located between the gate electrode 36 and the drain electrode 34, so that drain voltage resistance is further improved by equipotential lines that have been distributed, while the capacitance between the gate electrode 36 and the drain electrode 34 is reduced, resulting in higher power gain.

Although the semiconductor layer is composed of the undoped layer 39 in the second FET according to the third embodiment, the semiconductor layer may be composed of a lower undoped layer made of AlGaAs, an electron supplying layer made of $n^+$-type AlGaAs, and an upper undoped layer made of GaAs. What results is a semiconductor layer with a quantum-well structure including a hetero junction. In this case, the first step may be formed only in the upper undoped layer or formed continuously in the upper undoped layer and in the electron supplying layer across the boundary thereof. The second step may be formed continuously in the upper undoped layer and in the electron supplying layer across the boundary thereof or formed only in the electron supplying layer.

(Third FET of Third Embodiment)

A third FET according to the third embodiment of the present invention will be described.

In contrast to the first FET in which the conductive layer 31 and the contact region 32 have been formed by crystal growth, a conductive layer 31 and a contact region 32 are formed by ion implantation.

Figure 21:
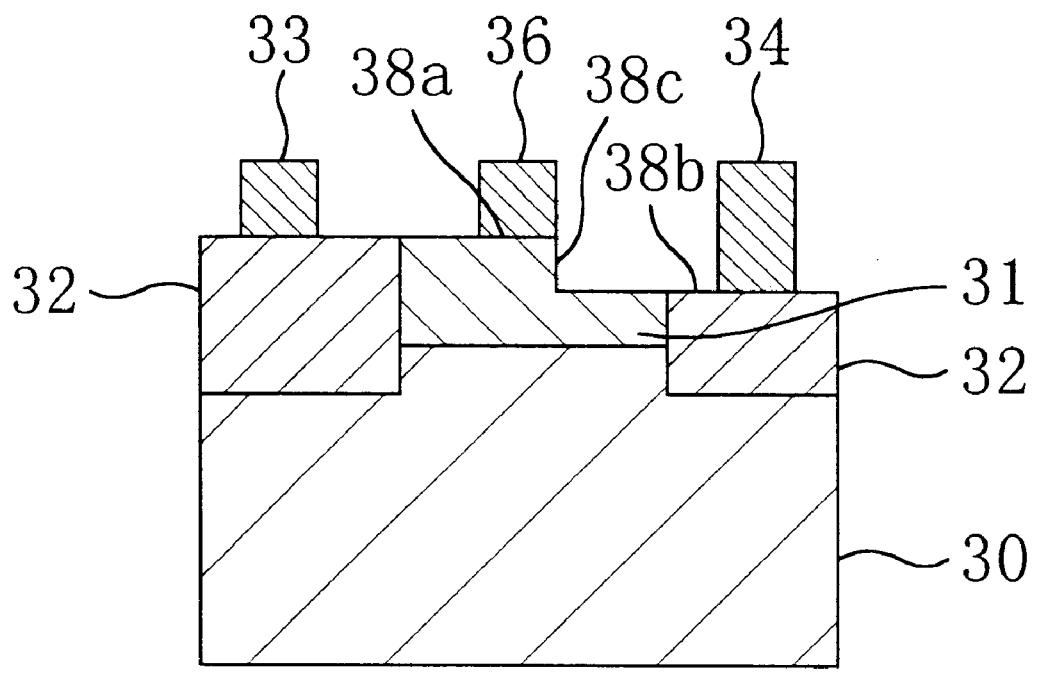
FIG. 21 is a cross-sectional view of a MESFET as a third FET according to the third embodiment.

FIG. 21 shows the cross-sectional structure of a MESFET as the third FET according to the third embodiment. As shown in the drawing, a conductive layer 31 made of n-type GaAs doped with Si as an impurity is formed on the central portion of a semi-insulating substrate 30 made of GaAs. A pair of contact regions 32 made of $n^+$-type GaAs heavily doped with Si as an impurity are formed on both sides of the conductive layer 31 in the semi-insulating substrate 30. A source electrode 33 is formed on the source-side contact region 32 to be in ohmic contact therewith. A gate electrode 36 is formed on the conductive layer 31 to form a Schottky junction therewith.

The third FET according to the third embodiment is characterized in that a step having an upper portion 38a, a lower portion 38b, and a vertical portion 38c is formed in the conductive layer 31. The upper portion 38a of the step is at the same level as the respective top faces of the source-side contact region 32 and of the conductive layer 31. In this case, the side face of the gate electrode 36 facing the drain electrode 34 may be flush with or protruding from the vertical portion 38c of the step. A drain electrode 34 is formed on the lower portion 38b of the step to be in ohmic contact with the drain-side contact region 32.

Thus, in the third FET according to the third embodiment, the step is formed in the region of the conductive layer 31 located between the gate electrode 36 and the drain electrode 34, so that drain voltage resistance is improved due to equipotential lines that have been distributed, resulting in reduced capacitance between the gate electrode 36 and the drain electrode 34 and higher power gain.

Because the step is formed in the conductive layer 31 or semiconductor layer, an undesired reduction in the value of the drain current is expected in the first to third FETs according to the third embodiment, but the result of simulation has proved no reduction in the value of the drain current even if the step is formed.

(First FET of Fourth Embodiment)

A first FET according to a fourth embodiment of the present invention will be described.

Figure 22:
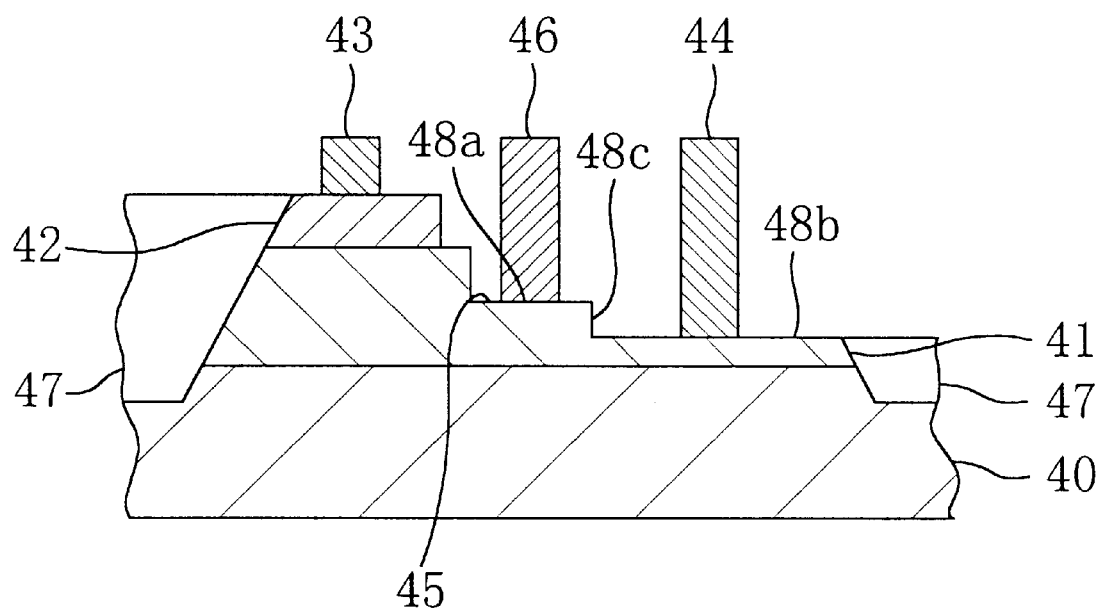
FIG. 22 is a cross-sectional view of a MESFET as a first FET according to a fourth embodiment of the present invention.

FIG. 22 shows the cross-sectional structure of a MESFET as the first FET according to the fourth embodiment. As shown in the drawing, a conductive layer 41 made of n-type GaAs doped with Si as an impurity is formed on a semi-insulating substrate 40 made of GaAs. A contact region 42 made of $n^+$-type GaAs is formed on the source-side region of the conductive layer 41 so that a source electrode 43 composed of a vapor deposited layer of AuGe or the like is formed on the contact region 42. In this case, the conductive layer 41 and the contact region 42 are formed by crystal growth. The source electrode 43 is in ohmic contact with the contact region 42. A gate recessed region 45 is formed in the conductive layer 41 so that a gate electrode 46 is formed on the gate recessed region 45 to form a Schottky junction with the conductive layer 41. An element isolation region 47 is formed around the conductive layer 41 and the contact regions 42.

The first FET according to the fourth embodiment is characterized in that a step having an upper portion 48a, a lower portion 48b, and a vertical portion 48c is formed in the gate recessed region 45 of the conductive layer 41. The depth of the step is half the depth of the gate recessed region 45. The upper portion 48a of the step is at the same level as the gate recessed region 45. A given space is provided between the vertical portion 48c of the step and the side face of the gate electrode 46 facing the drain electrode 44. A drain electrode 44 is formed on the lower portion 48b of the step to be in ohmic contact with the conductive layer 41.

Figure 23:
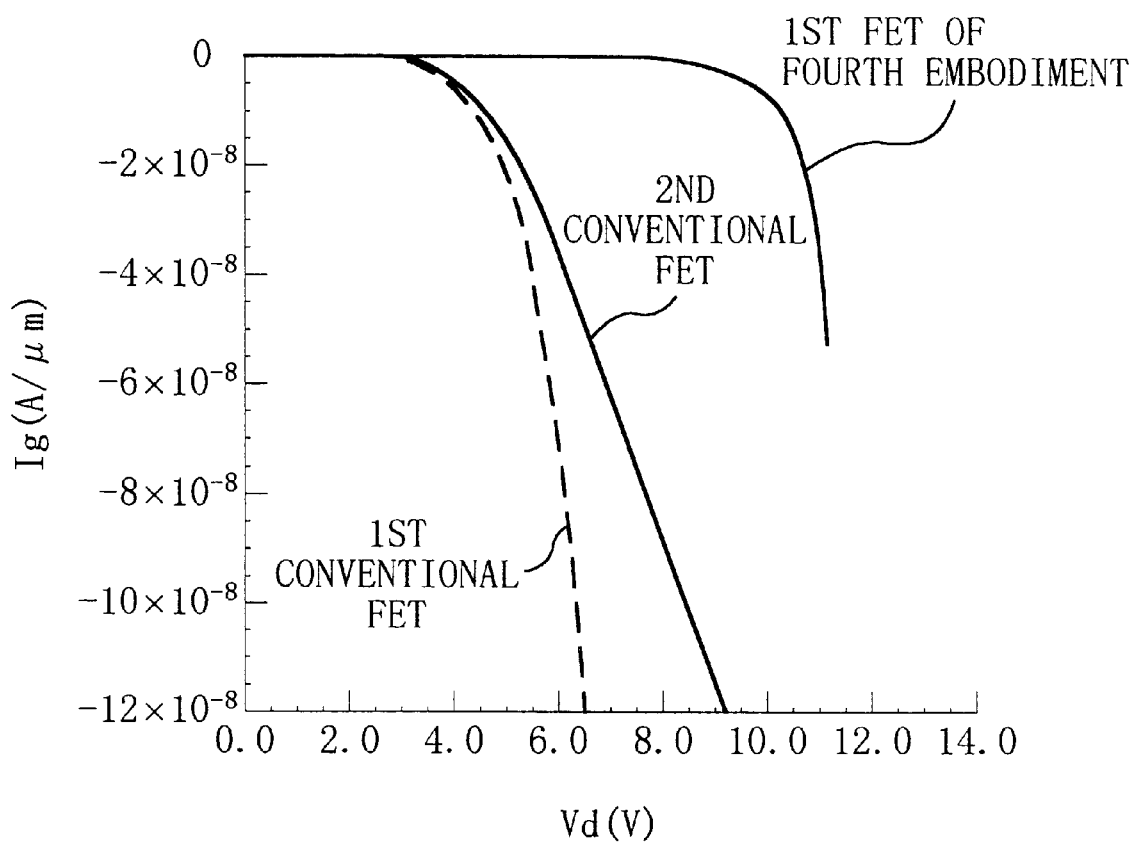
FIG. 23 shows the simulated voltage-resistant properties of the first FET according to the fourth embodiment and of the FETs according to the first and second conventional embodiments.

FIG. 23 shows the result of simulating the respective voltage-resistant properties of the first FET according to the fourth embodiment, the FET according to the first conventional embodiment shown in FIG. 46, and the FET according to the second conventional embodiment shown in FIG. 47 by using a device simulator. Simulation is performed by maintaining the source and gate voltages to 0 v, while varying the drain voltage. As is apparent from FIG. 23, the absolute value of a leakage current from the gate electrode is smaller in the first FET according to the fourth embodiment than in the FETs according to the first and second conventional embodiments, so that drain voltage resistance has been improved significantly.

Figure 24:
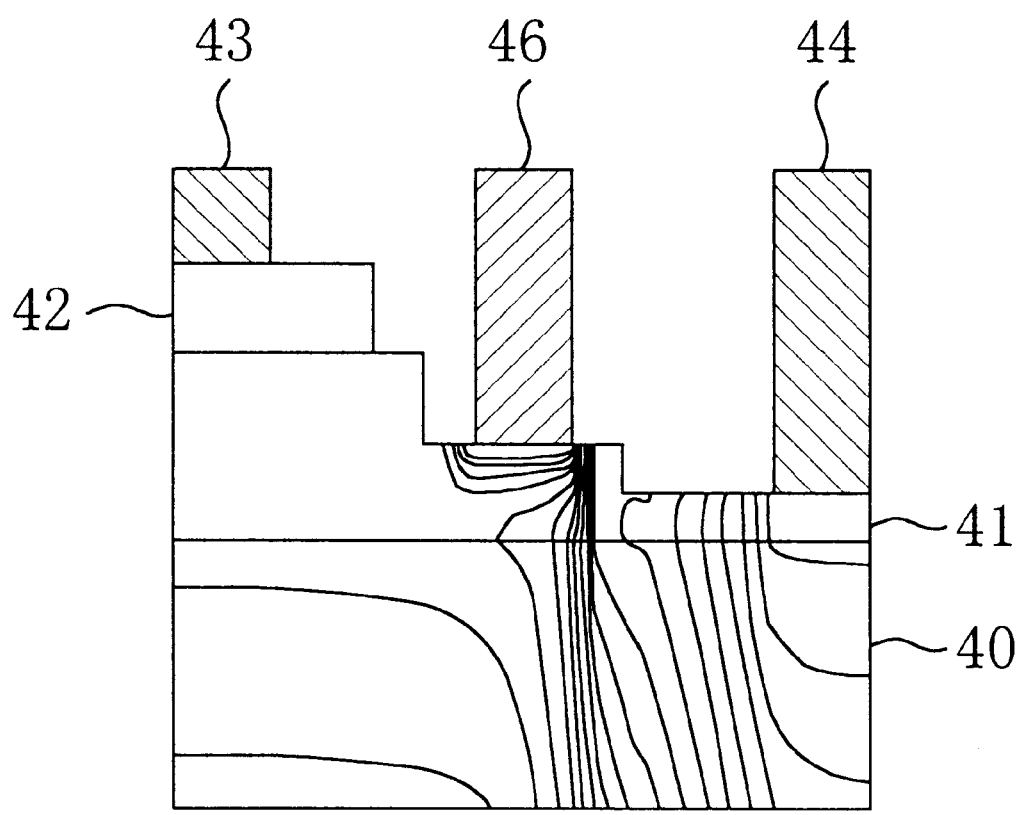
FIG. 24 shows the simulated distribution of equipotential lines in the first FET according to the fourth embodiment.

FIG. 24 shows the distribution of equipotential lines in the first FET according to the fourth embodiment, which is obtained by plotting points having the same potential in 0.05v steps (logarithmic representation) when the drain voltage is 7.5 v. In FIG. 24, the same bias conditions as used in FIGS. 49 and 50 are used.

As is apparent from comparison among FIGS. 24, 49, and 50, the equipotential lines are sparsely distributed in the lower portion 48b of the step of the conductive layer 41 in the first FET according to the fourth embodiment. Since the electric-field intensity is lower as the distribution of equipotential lines is more sparse, it will be understood that the electric-field intensity between the gate electrode 46 and the drain electrode 44 is lower in the first FET according to the fourth embodiment than in the FETs according to the first and second conventional embodiments. As a result, drain voltage resistance is improved in the first FET according to the fourth embodiment.

(Second FET of Fourth Embodiment)

A second FET according to the fourth embodiment of the present invention will be described.

In contrast to the MESFET as the first FET having the gate electrode formed on the conductive layer, an undoped layer is formed on the conductive layer and a gate electrode is formed on the undoped layer in a MISFET as the second FET.

Figure 25:
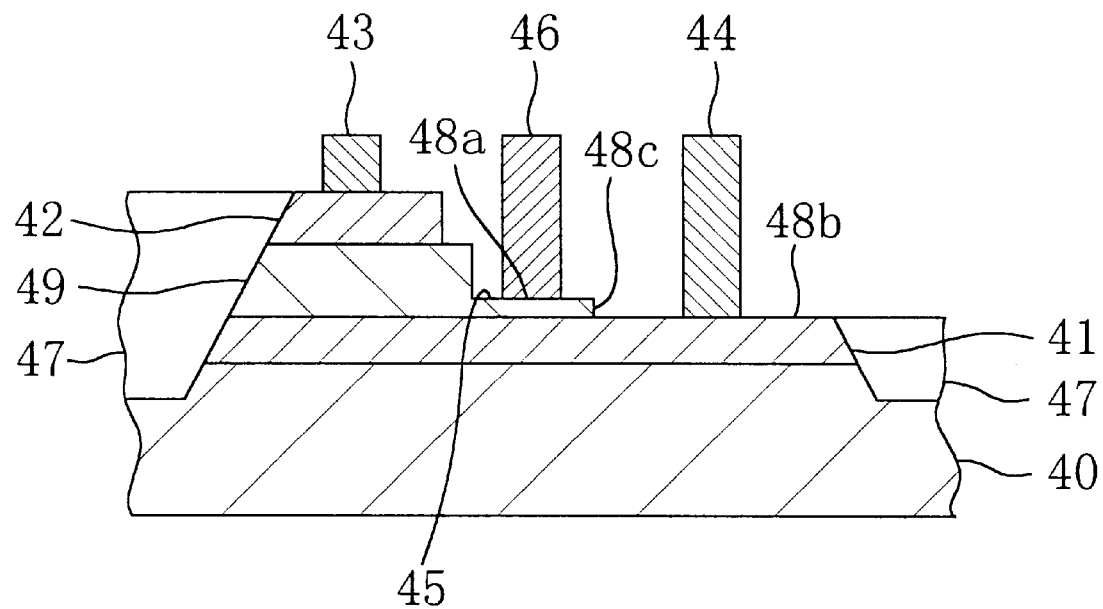
FIG. 25 is a cross-sectional view of a MISFET as a second FET according to the fourth embodiment.

FIG. 25 shows the cross-sectional structure of the MISFET as the second FET according to the fourth embodiment. As shown in the drawing, the conductive layer 41 made of n-type GaAs doped with Si as an impurity is formed on a semi-insulating substrate 40 made of GaAs. The undoped layer 49 as a semiconductor layer made of GaAs or AlGaAs undoped with an impurity is formed on the conductive layer 41. A contact region 42 made of $n^+$-type GaAs heavily doped with Si as an impurity is formed on the source-side region of the undoped layer 49. A source electrode 43 composed of a vapor deposited layer of AuGe or the like is formed on the contact region 42. In this case, the conductive layer 41, the undoped layer 49, and the contact region 42 are formed by crystal growth. The source electrode 43 is in ohmic contact with the contact region 42. A gate recessed region 45 is formed in the undoped layer 49 so that a gate electrode 46 is formed on the gate recessed region 45 to form a Schottky junction with the conductive layer 41. An element isolation region 47 is formed around the conductive layer 41 and the contact region 42.

The second FET according to the fourth embodiment is characterized in that a step having an upper portion 48a, a lower portion 48b, and a vertical portion 48c is formed in the gate recessed region 45 of the undoped layer 49. The depth of the step is half the depth of the gate recessed region 45. The upper portion 48a of the step is at the same level as the gate recessed region 45. The lower portion 48b of the step is at the same level as the conductive layer 41. A given spacing is provided between the vertical portion 48c of the step and the side face of the gate electrode 46 facing the drain electrode 44. A drain electrode 44 is formed on the lower portion 48b of the step to be in ohmic contact with the conductive layer 41.

Thus, in the second FET according to the fourth embodiment, the step is formed in the region of the undoped layer 49 located between the gate electrode 46 and the drain electrode 44, so that equipotential lines are distributed, resulting in improved drain voltage resistance.

Although the semiconductor layer is composed of the undoped layer 49 in the second FET according to the fourth embodiment, the semiconductor layer may be composed of a lower undoped layer made of AlGaAs, an electron supplying layer made of $n^+$-type AlGaAs, and an upper undoped layer made of GaAs. What results is a semiconductor layer with a quantum-well structure including a hetero junction. In this case, the step may be formed only in the upper undoped layer or formed continuously in the upper undoped layer and the electron supplying layer across the boundary thereof.

(Third FET of Fourth Embodiment)

A third FET according to the fourth embodiment of the present invention will be described.

In contrast to the first FET in which the conductive layer 41 and the contact regions 42 are formed by crystal growth, a conductive layer 41 and contact regions 42 are formed by ion implantation in the third FET.

Figure 26:
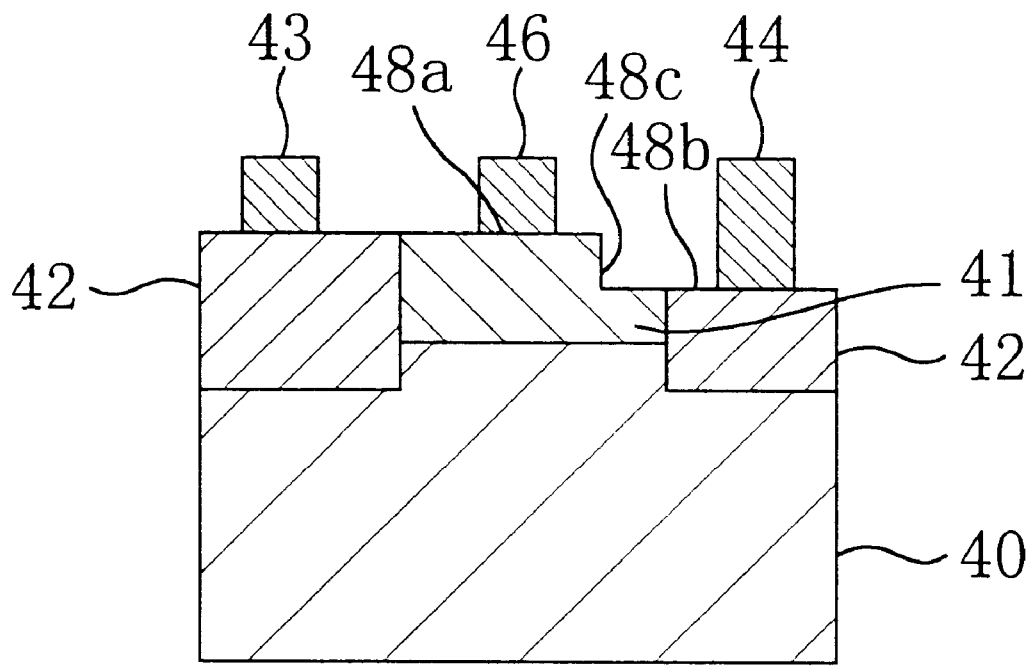
FIG. 26 is a cross-sectional view of a MESFET as a third FET according to the fourth embodiment.

FIG. 26 shows the cross-sectional structure of a MESFET as the third FET according to the fourth embodiment. As shown in the drawing, the conductive layer 41 made of n-type GaAs doped with Si as an impurity is formed on the central portion of a semi-insulating substrate 40 made of GaAs. A pair of contact regions 42 made of $n^+$-type GaAs heavily doped with Si as an impurity are formed on both sides of the conductive layer 41 of the semi-insulating substrate 40. A source electrode 43 is formed on the contact region 42 on the source side to be in ohmic contact therewith. A gate electrode 46 is formed on the conductive layer 41 to form a Schottky junction therewith.

The third FET according to the fourth embodiment is characterized in that a step having an upper portion 48a, a lower portion 48b, and a vertical portion 48c is formed in the conductive layer 41. The upper portion 48a of the step is at the same level as the contact region 42 on the source side and the top face of the conductive layer 41. A given spacing is provided between the vertical portion 48c of the step and the side face of the gate electrode 36 facing the drain electrode 34. A drain electrode 44 is formed on the lower portion 48b of the step to be in ohmic contact with the contact region 42 on the drain side.

Thus, in the third FET according to the fourth embodiment, since the step is formed in the region of the conductive layer 41 located between the gate electrode 46 and the drain electrode 44, equipotential lines are distributed, resulting in improved drain voltage resistance.

Because the step is formed in the region of the conductive layer 41 or semiconductor layer, an undesired reduction in the value of the drain current is expected in the first to third FETs according to the fourth embodiment, but the result of simulation has proved no reduction in the value of the drain current even if the step is formed.

The element isolation regions 17, 27, 37, and 47 according to the first to fourth embodiments may be formed by etching or by implanting ions of boron, oxygen, or the like.

(Manufacturing Method for First FET of First Embodiment)

Referring to FIGS. 27 to 30, a method of manufacturing the first FET according to the first embodiment will be described.

Figure 27A:
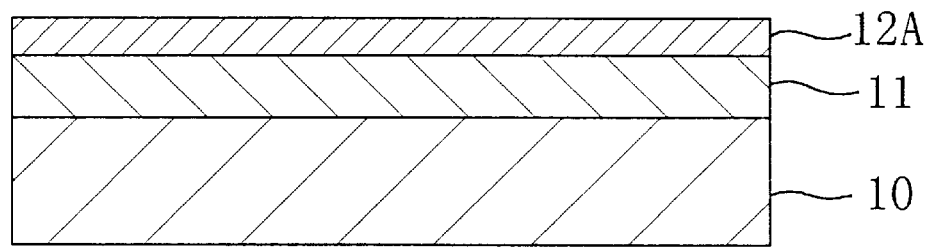
FIGS. 27($a$) and 27($b$) are cross-sectional views illustrating individual process steps in accordance with a method of manufacturing the first FET of the first embodiment.

First, as shown in FIG. 27(a), the conductive layer 11 made of n-type GaAs doped with Si as an impurity and a contact layer 12A made of n⁺-type GaAs heavily doped with Si as an impurity are formed sequentially on the semi-insulating substrate 10 made of GaAs by crystal growth.

Figure 27B:
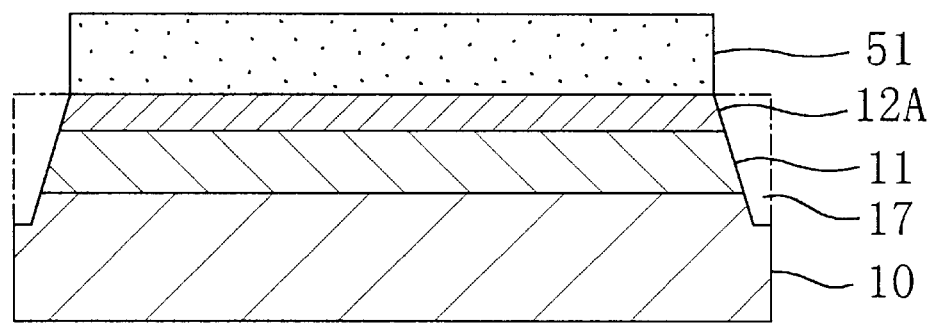

Next, as shown in FIG. 27(b), a first resist pattern 51 is formed on the contact layer 12A. Then, wet etching is performed by using the first resist pattern 51 as a mask to thoroughly remove the portions of the contact layer 12A and conductive layer 11 uncovered with the first resist pattern 51 and selectively remove a portion of the semi-insulating substrate 10 corresponding to a given depth, thereby forming the element isolation region 17. After that, the first resist pattern 51 is removed.

Figure 28A:
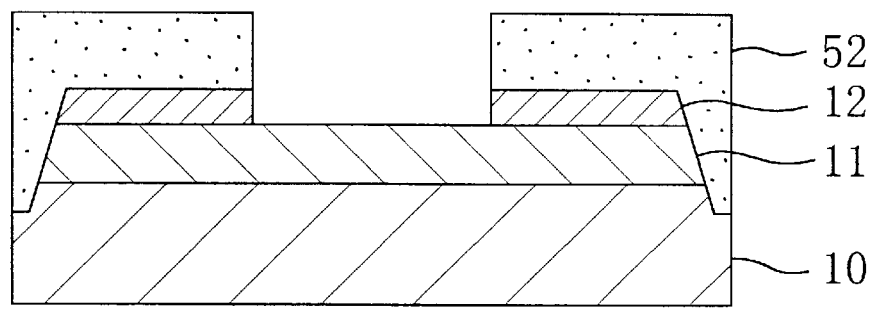
FIGS. 28($a$) and 28($b$) are cross-sectional views illustrating individual process steps in accordance with the method of manufacturing first FET of the first embodiment.

Next, as shown in FIG. 28(a), a second resist pattern 52 is formed on the semi-insulating substrate 10. Then, wet etching is performed with respect to the contact layer 12A by using the second resist pattern 52 as a mask to form the contact regions 12. After that, the second resist pattern 52 is removed.

Figure 28B:
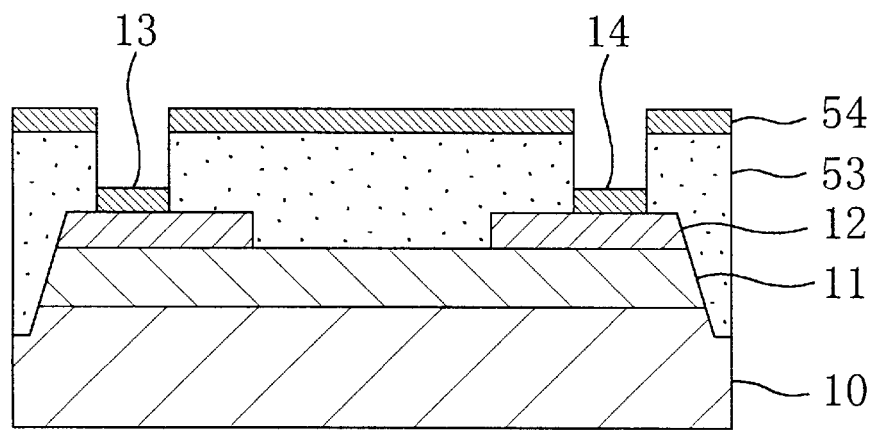

Next, as shown in FIG. 28(b), a third resist pattern 53 is formed on the semi-insulating substrate 10. Then, a first metal film 54 made of vapor deposited AuGe or the like is formed by using the third resist pattern 53 as a mask. Subsequently, the third resist pattern 53 is lifted off so that the source and drain electrodes 13 and 14 are formed.

Figure 29A:
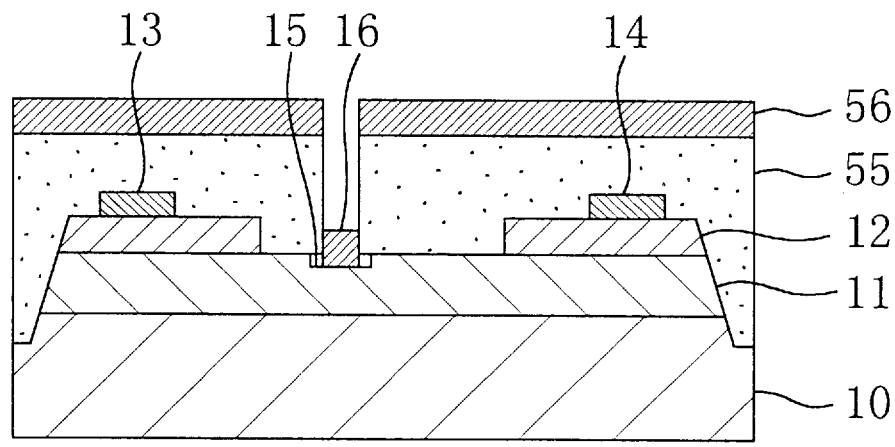
FIGS. 29($a$) and 29($b$) are cross-sectional views illustrating individual process steps in accordance with the method of manufacturing the first FET of the first embodiment.

Next, as shown in FIG. 29(a), a fourth resist pattern 55 is formed on the semi-insulating substrate 10. Then, wet etching is performed by using the fourth resist pattern 55 as a mask to remove the surface region of the conductive layer 11 located between the source and drain regions and thereby form the gate recessed region 15. Thereafter, a second metal film 56 made of vapor deposited Ti/Al or the like is formed by using the fourth resist pattern 55 as a mask. Subsequently, the fourth resist pattern 55 is lifted off so that the gate electrode 16 is formed.

Figure 29B:
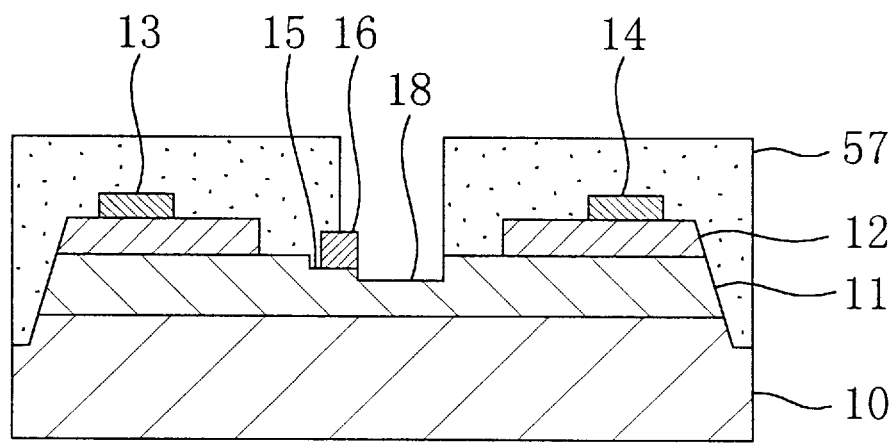
Figure 30:
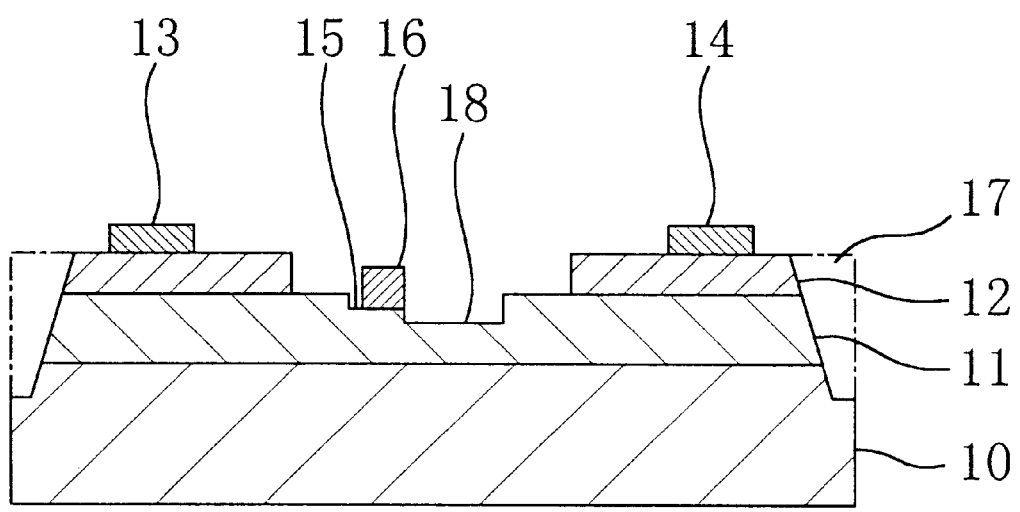
FIG. 30 is a cross-sectional view illustrating a process step in accordance with the method of manufacturing the first FET of the first embodiment.

Next, as shown in FIG. 29(b), a fifth resist pattern 57 is formed on the semi-insulating substrate 10. Then, wet etching is performed by using the fifth resist pattern 57 and the gate electrode 16 as a mask to remove the surface region of the conductive layer 11 located between the gate electrode 16 and the drain electrode 14 and thereby form the depressed portion 18. In this case, the depressed portion 18 is formed by wet etching using the gate electrode 16 as a mask. The side face of the gate electrode 16 facing the drain electrode 14 may be flush with or protruding from the wall face of the depressed portion 18 closer to the gate electrode 16. The fifth resist pattern 57 is then removed, whereby the first FET according to the first embodiment as shown in FIG. 30 is completed.

(Manufacturing Method for Second FET of First Embodiment)

Referring to FIGS. 31 to 34, a method of manufacturing the second FET according to the first embodiment will be described.

Figure 31A:
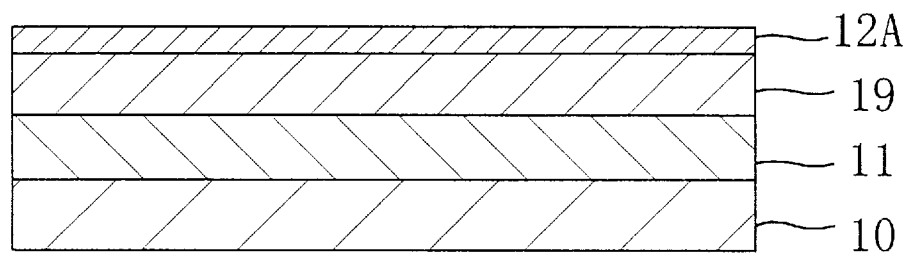
FIGS. 31($a$) and 31($b$) are cross-sectional views illustrating individual process steps in accordance with a method of manufacturing the second FET of the first embodiment.

First, as shown in FIG. 31(a), the conductive layer 11 made of n-type GaAs doped with Si as an impurity, the undoped layer 19 undoped with Si, and a contact layer 12A made of n⁺-type GaAs heavily doped with Si as an impurity are formed sequentially on the semi-insulating substrate 10 made of GaAs by crystal growth.

Figure 31B:
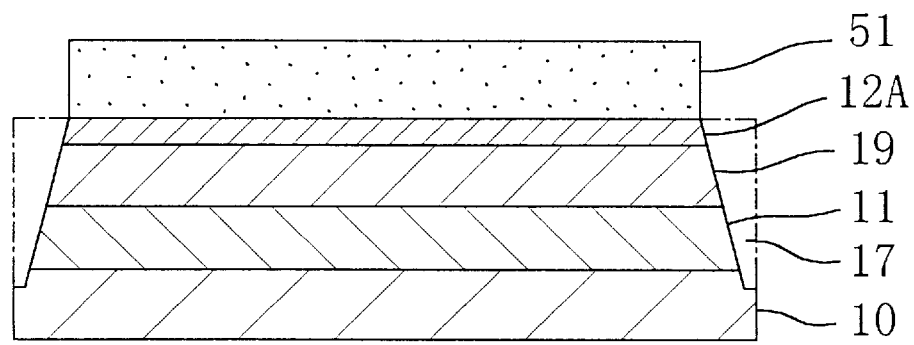

Next, as shown in FIG. 31(b), a first resist pattern 51 is formed on the contact layer 12A. Then, wet etching is performed by using the first resist pattern 51 as a mask to thoroughly remove the portions of the contact layer 12A and conductive layer 11 uncovered with the first resist pattern 51 and selectively remove a portion of the semi-insulating substrate 10 corresponding to a given depth, thereby forming the element isolation region 17. After that, the first resist pattern 51 is removed.

Figure 32A:
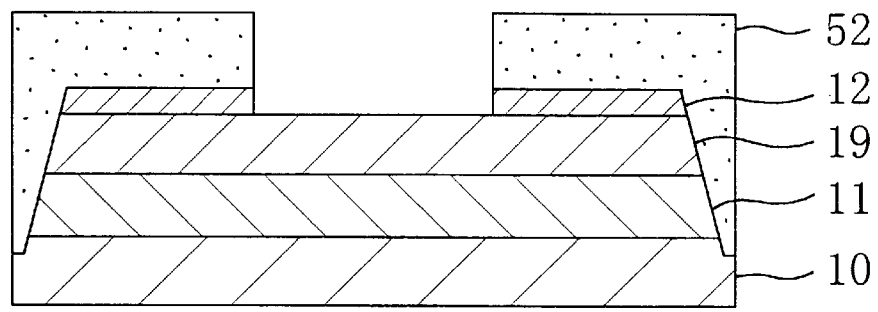
FIGS. 32($a$) and 32($b$) are cross-sectional views illustrating individual process steps in accordance with the method of manufacturing the second FET of the first embodiment.

Next, as shown in FIG. 32(a), a second resist pattern 52 is formed on the semi-insulating substrate 10. Then, wet etching is performed with respect to the contact layer 12A by using the second resist pattern 52 as a mask to form the contact regions 12. After that, the second resist pattern 52 is removed.

Figure 32B:
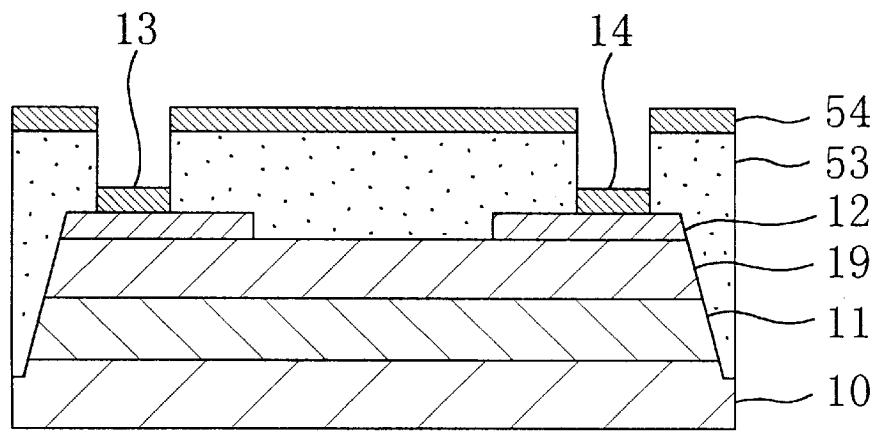

Next, as shown in FIG. 32(b), a third resist pattern 53 is formed on the semi-insulating substrate 10. Then, a first metal film 54 made of vapor deposited AuGe or the like is formed by using the third resist pattern 53 as a mask. Subsequently, the third resist pattern 53 is lifted off so that the source and drain electrodes 13 and 14 are formed.

Figure 33A:
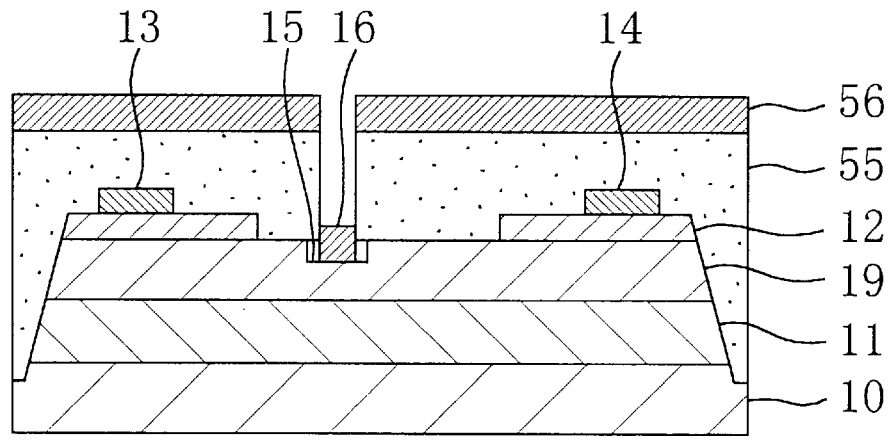
FIGS. 33($a$) and 33$b$) are cross-sectional views illustrating individual process steps in accordance with the method of manufacturing the second FET of the first embodiment.

Next, as shown in FIG. 33(a), a fourth resist pattern 55 is formed on the semi-insulating substrate 10. Then, wet etching is performed by using the fourth resist pattern 55 as a mask to remove the surface region of the undoped layer 19 located between the source and drain regions and thereby form the gate recessed region 15. Thereafter, a second metal film 56 made of vapor deposited Ti/Al or the like is formed by using the fourth resist pattern 55 as a mask. Subsequently, the fourth resist pattern 55 is lifted off so that the gate electrode 16 is formed.

Figure 33B:
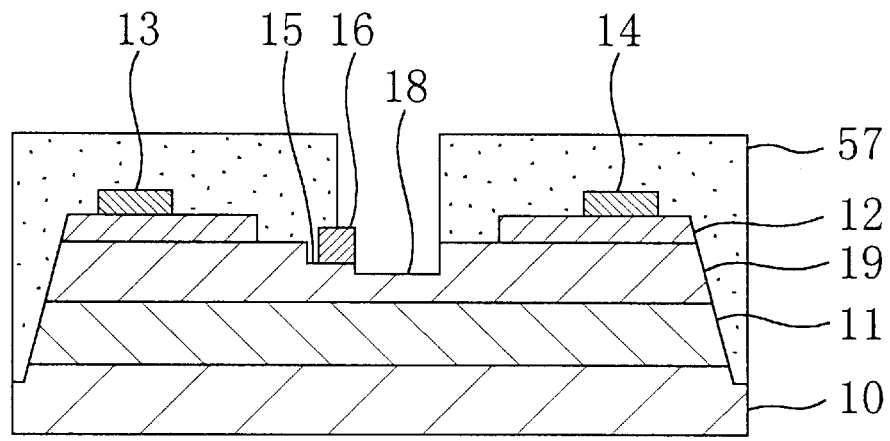
Figure 34:
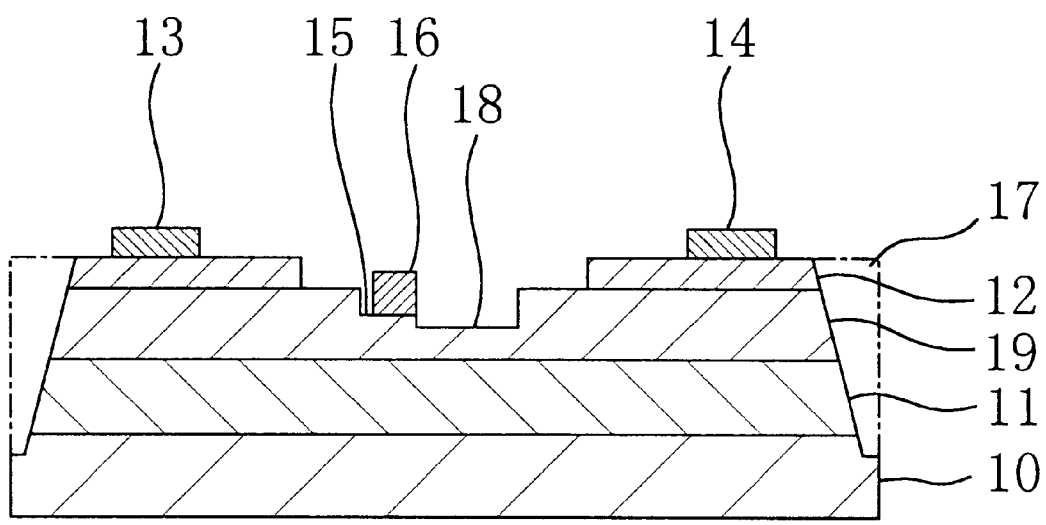
FIG. 34 is a cross-sectional view illustrating a process step in accordance with the method of manufacturing the second FET of the first embodiment.

Next, as shown in FIG. 33(b), a fifth resist pattern 57 is formed on the semi-insulating substrate 10. Then, wet etching is performed by using the fifth resist pattern 57 and the gate electrode 16 as a mask to remove the surface region of the undoped layer 19 located between the gate electrode 16 and the drain electrode 14 and thereby form the depressed portion 18. In this case, the depressed portion 18 is formed by wet etching using the gate electrode 16. The side face of the gate electrode 16 facing the drain electrode 14 may be flush with or protruding from the wall face of the depressed portion 18 closer to the gate electrode 16. The fifth resist pattern 57 is then removed, whereby the second FET according to the first embodiment as shown in FIG. 34 is completed.

(Manufacturing Method for Third FET of Second Embodiment)

Referring to FIGS. 35 to 37, a method of manufacturing the third FET according to the second embodiment will be described.

Figure 35A:
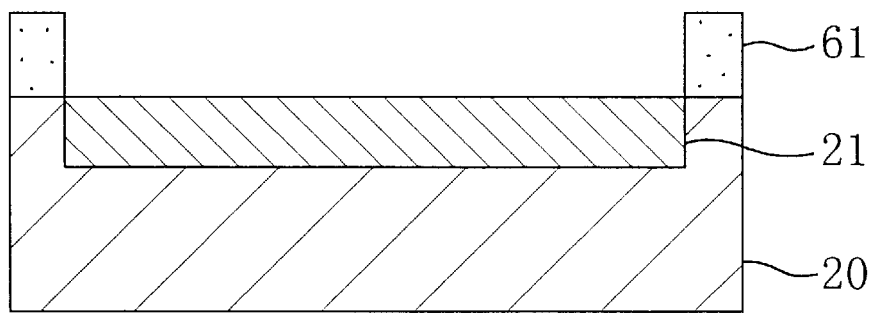
FIGS. 35($a$) and 35($b$) are cross-sectional views illustrating individual process steps in accordance with a method of manufacturing the third FET of the second embodiment.

First, as shown in FIG. 35(a), a first resist pattern 61 is formed on the semi-insulating substrate 20 made of GaAs. Then, Si ions are implanted into the semi-insulating substrate 20 by using the first resist pattern 61 as a mask to form the conductive layer 21. After that, the first resist pattern 61 is removed.

Figure 35B:
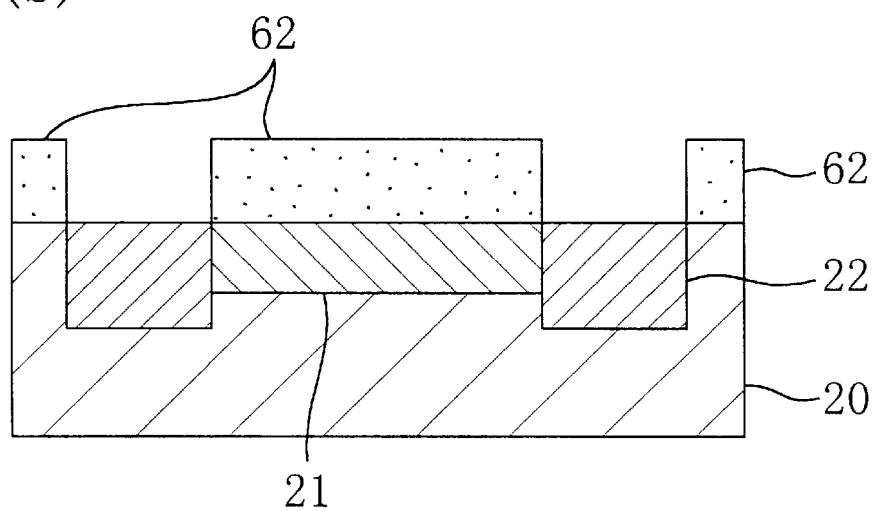

Next, as shown in FIG. 35(b), a second resist pattern 62 is formed on the semi-insulating substrate 20. Then, Si ions are implanted into the semi-insulating substrate 20 by using the second resist pattern 62 as a mask to form the contact regions 22 on both sides of the conductive layer 21. After that, the second resist pattern 62 is removed.

Figure 36A:
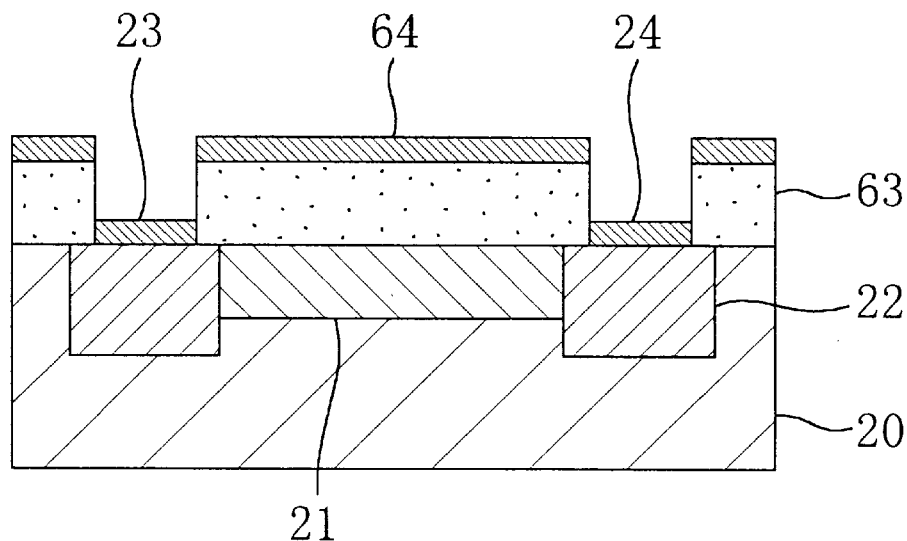
FIGS. 36($a$) and 36($b$) are cross-sectional views illustrating individual process steps in accordance with the method of manufacturing the third FET of the second embodiment.

Next, as shown in FIG. 36(a), a third resist pattern 63 is formed on the semi-insulating substrate 20. Then, a first metal film 64 made of vapor deposited AuGe or the like is formed by using the third resist pattern 63 as a mask. Subsequently, the third resist pattern 63 is lifted off so that the source electrode 23 and the drain electrode 24 are formed.

Figure 36B:
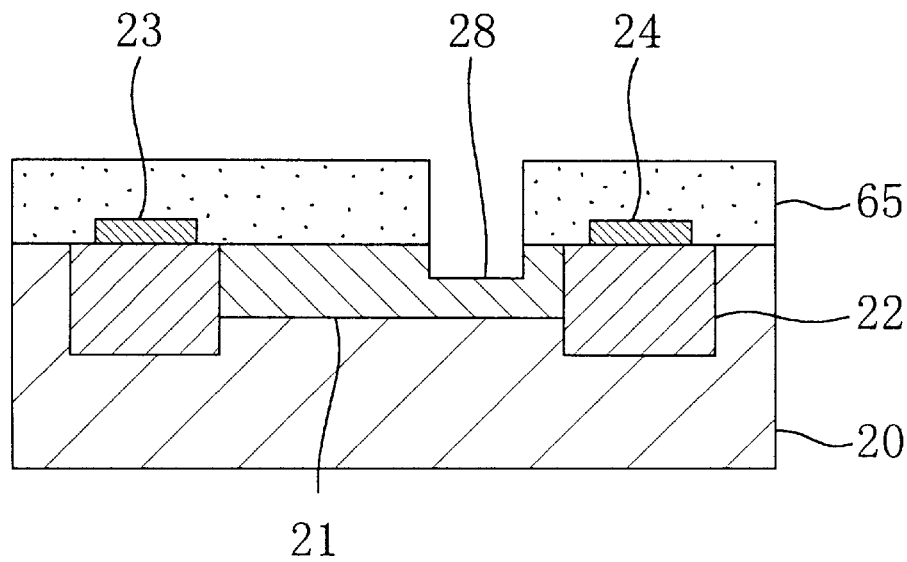

Next, as shown in FIG. 36(b), a fourth resist pattern 65 is formed on the semi-insulating substrate 20. Then, wet etching is performed by using the fourth resist pattern 65 as a mask to form the depressed portion 28 in the region of the conductive layer 21 closer to the drain electrode 24. After that, the fourth resist pattern 65 is removed.

Figure 37A:
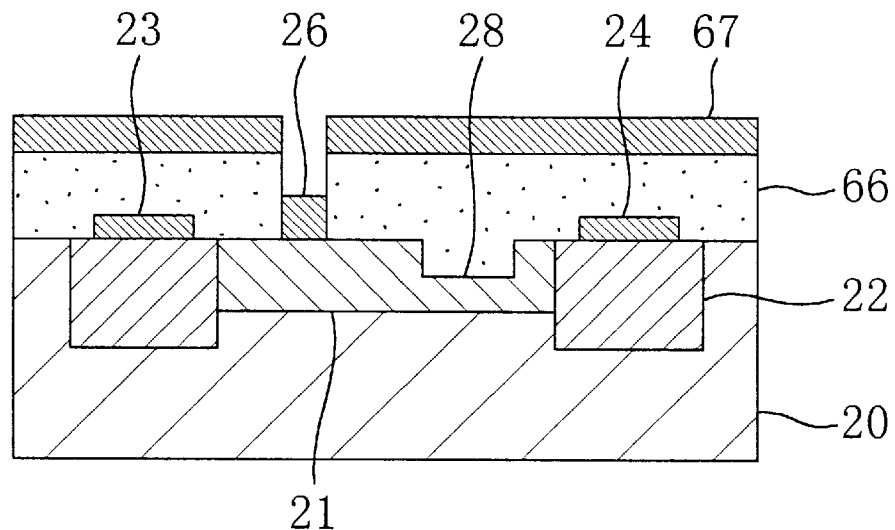
FIGS. 37($a$) and 37($b$) are cross-sectional views illustrating individual process steps in accordance with the method of manufacturing the third FET of the second embodiment.
Figure 37B:
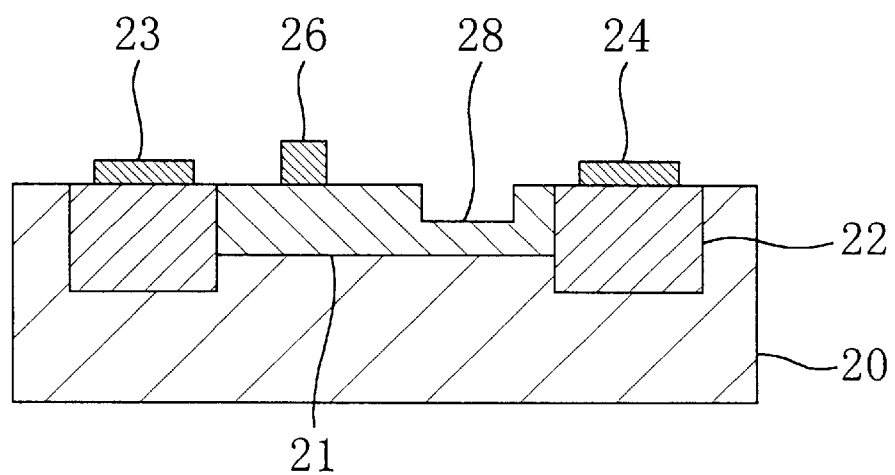

Next, as shown in FIG. 37(a), a fifth resist pattern 66 is formed on the semi-insulating substrate 20. Then, a second metal film 67 made of vapor deposited Ti/Al or the like is formed by using the fifth resist pattern 66 as a mask. Subsequently, the fifth resist pattern 66 is lifted off so that the gate electrode 26 is formed, whereby the third FET according to the second embodiment as shown in FIG. 37(b) is completed.

(Manufacturing Method for First FET of Third Embodiment)

Referring to FIGS. 38 to 41, a method of manufacturing the first FET according to the third embodiment will be described.

Figure 38A:
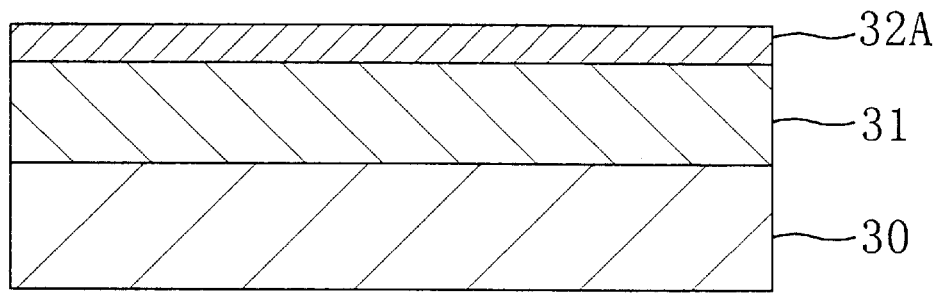
FIGS. 38($a$) and 38($b$) are cross-sectional views illustrating individual process steps in accordance with a method of manufacturing the first FET of the third embodiment.

First, as shown in FIG. 38(a), the conductive layer 31 made of n-type GaAs doped with Si as an impurity and a contact layer 32A made of $n^+$-type GaAs heavily doped with Si as an impurity are formed sequentially on the semi-insulating substrate 30 made of GaAs by crystal growth.

Figure 38B:
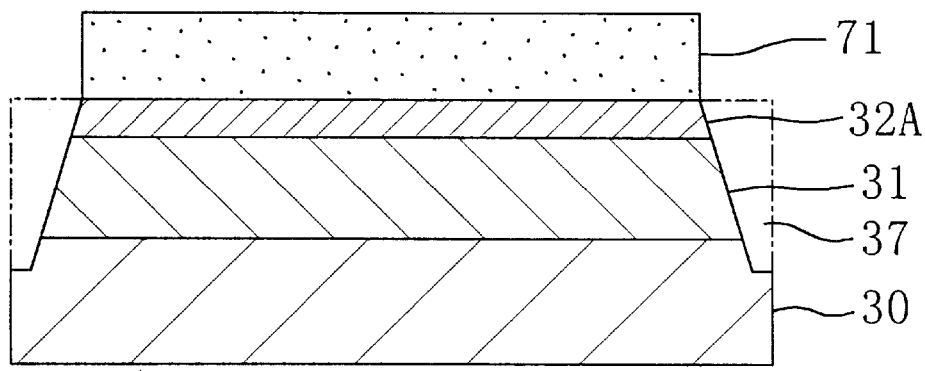

Next, as shown in FIG. 38(b), a first resist pattern 71 is formed on the contact layer 32A. Then, wet etching is performed by using the first resist pattern 71 as a mask to thoroughly remove the portions of the contact layer 32A and conductive layer 31 uncovered with the first resist pattern 71 and selectively remove a portion of the semi-insulating substrate 30 corresponding to a given depth, thereby forming the element isolation region 37. After that, the first resist pattern 71 is removed.

Figure 39A:
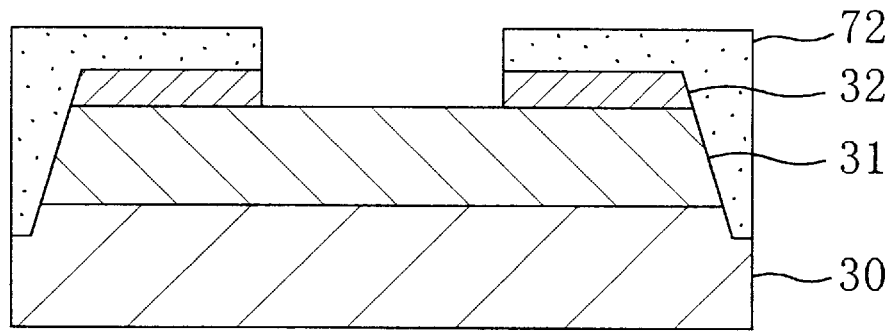
FIGS. 39($a$) and 39($b$) are cross-sectional views illustrating individual process steps in accordance with the method of manufacturing the first FET of the third embodiment.

Next, as shown in FIG. 39(a), a second resist pattern 72 is formed on the semi-insulating substrate 30. Then, wet etching is performed with respect to the contact layer 32A by using the second resist pattern 72 as a mask to form the contact regions 32. After that, the second resist pattern 72 is removed.

Figure 39B:
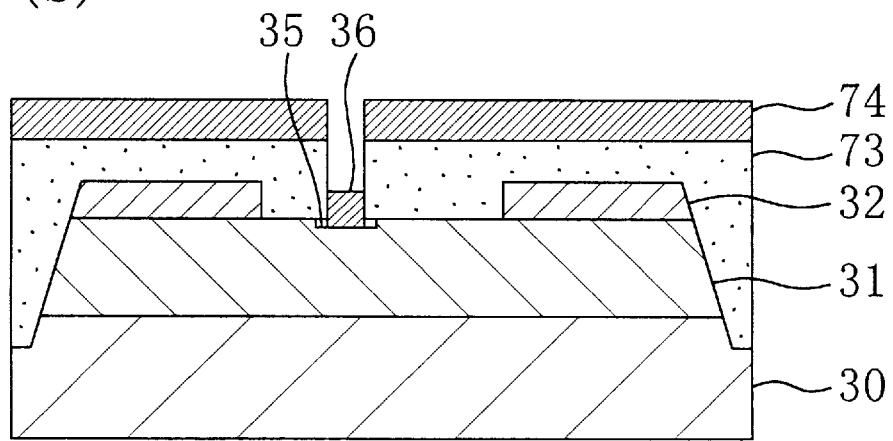

Next, as shown in FIG. 39(b), a third resist pattern 73 is formed on the semi-insulating substrate 30. Then, wet etching is performed by using the third resist pattern 73 as a mask to remove the surface region of the conductive layer 31 located between the source and drain regions and thereby form the gate recessed region 35. Thereafter, a first metal film 74 made of vapor deposited Ti/Al or the like is formed by using the third resist pattern 73 as a mask. Subsequently, the third resist pattern 73 is lifted off so that the gate electrode 36 is formed.

Figure 40A:
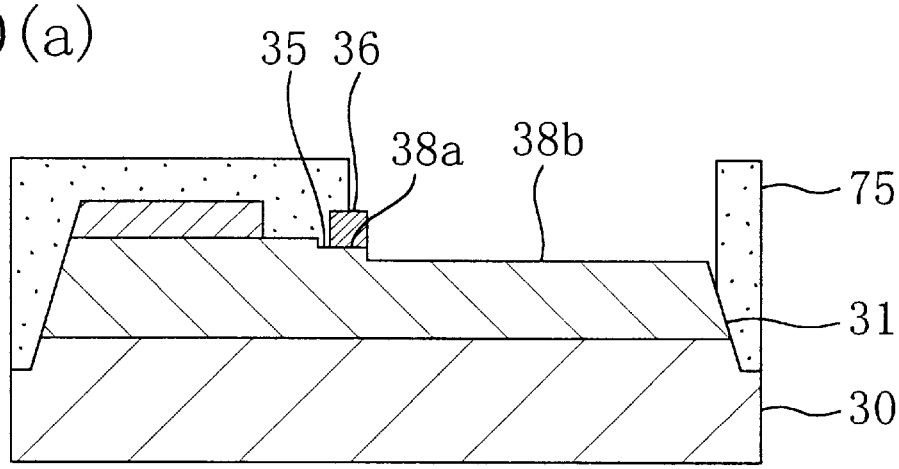
FIGS. 40($a$) and 40($b$) are cross-sectional views illustrating individual process steps in accordance with the method of manufacturing the first FET of the third embodiment.

Next, as shown in FIG. 40(a), a fourth resist pattern 75 is formed on the semi-insulating substrate 30. Then, wet etching is performed by using the fourth resist pattern 75 and the gate electrode 36 as a mask to remove the drain-side surface region of the conductive layer 31 to form the first step having the upper portion 38a and the lower portion 38b. Thereafter, the fourth resist pattern 75 is removed.

Figure 40B:
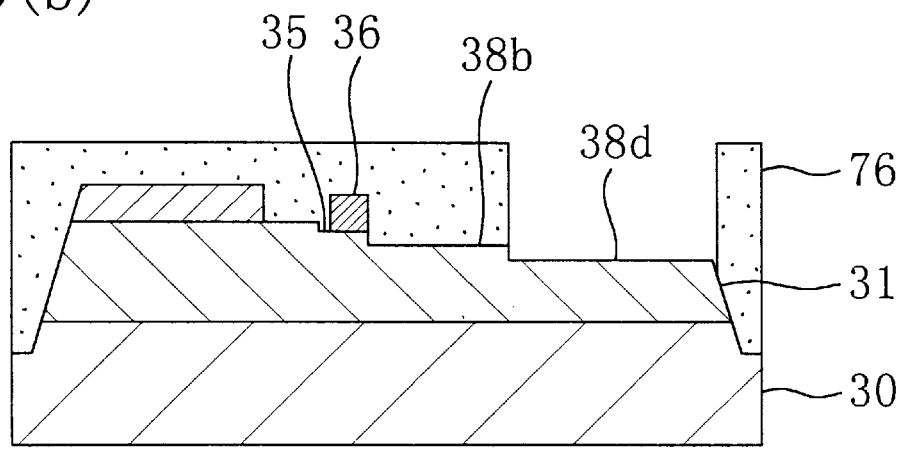

Next, as shown in FIG. 40(b), a fifth resist pattern 76 is formed on the semi-insulating substrate 30. Then, the second step having the upper portion 38b (corresponding to the lower portion of the first step) and the lower portion 38d is formed. After that, the fifth resist pattern 76 is removed.

Figure 41A:
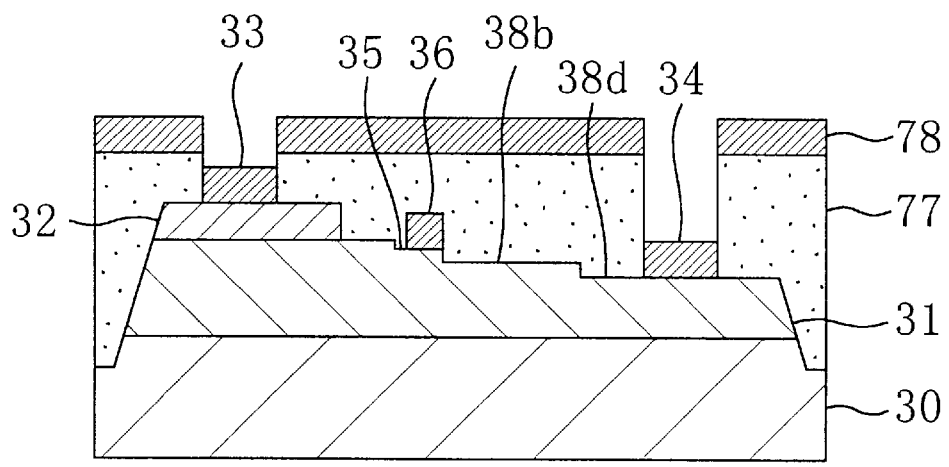
FIGS. 41($a$) and 41($b$) are cross-sectional views illustrating individual process steps in accordance with the method of manufacturing the first FET of the third embodiment.

Next, as shown in FIG. 41(a), a sixth resist pattern 77 is formed on the semi-insulating substrate 30. Then, a second metal film 78 made of vapor deposited AuGe or the like is formed by using the sixth resist pattern 77 as a mask. Subsequently, the sixth resist pattern 77 is lifted off so that the source electrode 33 and the drain electrodes 34 are formed.

Figure 41B:
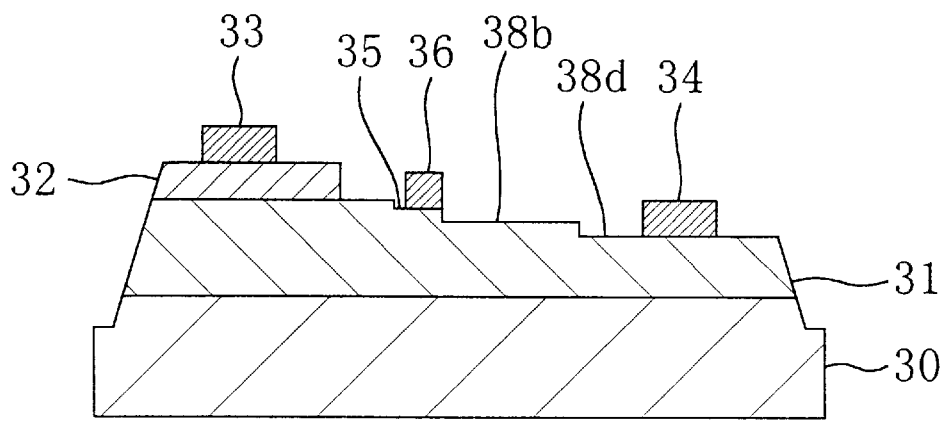

Next, the sixth resist pattern 77 is removed, whereby the first FET according to the third embodiment as shown in FIG. 41(b) is completed.

(Manufacturing Method for Second FET of Third Embodiment)

Referring to FIGS. 42 to 45, a method of manufacturing the second FET according to the third embodiment will be described.

Figure 42A:
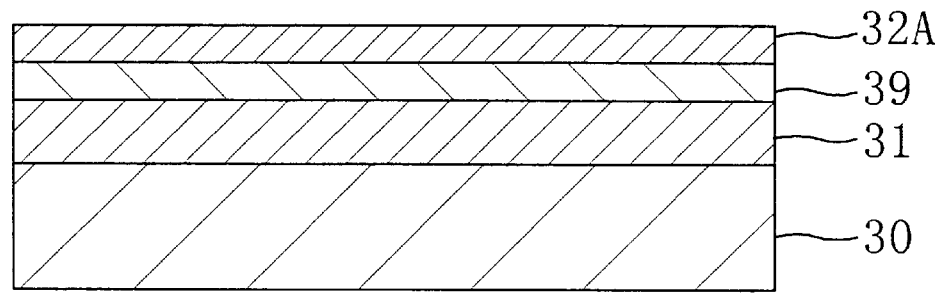
FIGS. 42($a$) and 42($b$) are cross-sectional views illustrating individual process steps in accordance with a method of manufacturing the second FET of the third embodiment.

First, as shown in FIG. 42(a), the conductive layer 31 made of n-type GaAs doped with Si as an impurity, the undoped layer 39 undoped with Si, and a contact layer 32A made of $n^+$-type GaAs heavily doped with Si as an impurity are formed sequentially on the semi-insulating substrate 30 made of GaAs by crystal growth.

Figure 42B:
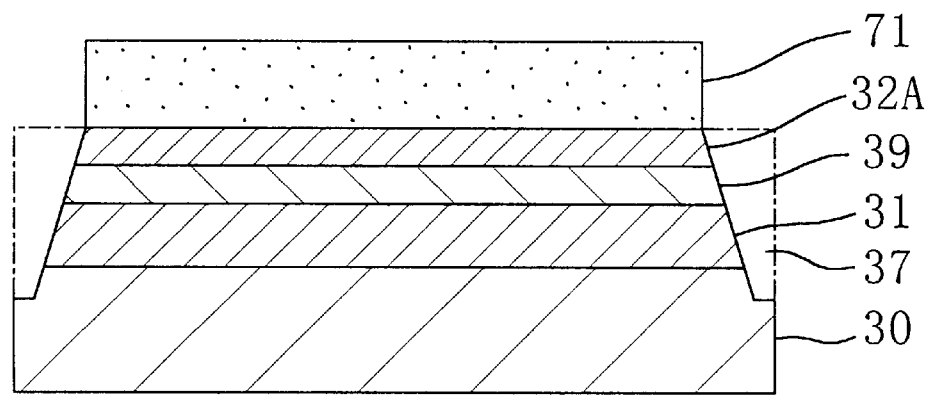

Next, as shown in FIG. 42(b), a first resist pattern 71 is formed on the contact layer 32A. Then, wet etching is performed by using the first resist pattern 71 as a mask to thoroughly remove the portions of the contact layer 32A, undoped layer 39, and conductive layer 31 uncovered with the first resist pattern 71 and selectively remove a portion of the semi-insulating substrate 30 corresponding to a given depth, thereby forming the element isolation region 37. After that, the first resist pattern 71 is removed.

Figure 43A:
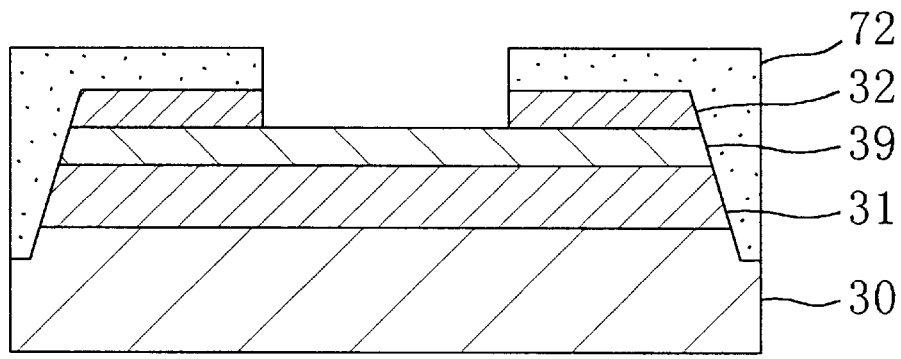
FIGS. 43($a$) and 43($b$) are cross-sectional views illustrating individual process steps in accordance with the method of manufacturing the second FET of the third embodiment.

Next, as shown in FIG. 43(a), a second resist pattern 72 is formed on the semi-insulating substrate 30. Then, wet etching is performed with respect to the contact layer 32A by using the second resist pattern 72 as a mask to form the contact regions 32. After that, the second resist pattern 72 is removed.

Figure 43B:
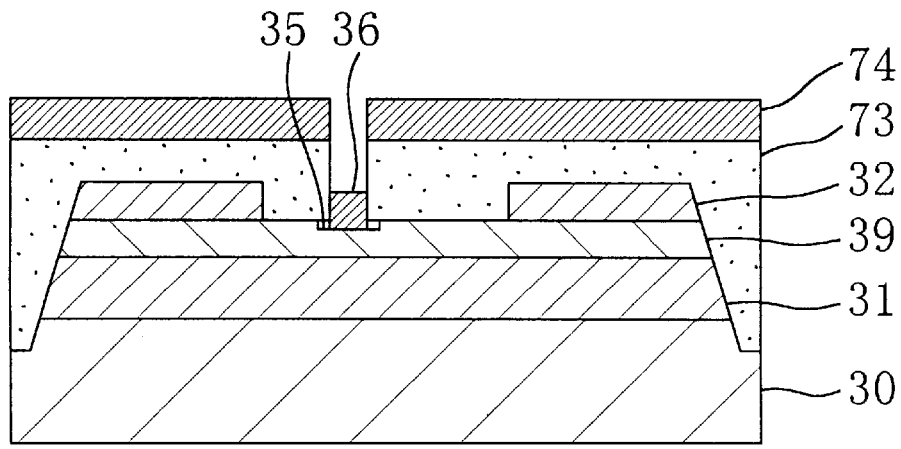

Next, as shown in FIG. 43(b), a third resist pattern 73 is formed on the semi-insulating substrate 30. Then, wet etching is performed by using the third resist pattern 73 as a mask to remove the surface region of the undoped layer 39 located between the source and drain regions and thereby form the gate recessed region 35. Thereafter, a first metal film 74 made of vapor deposited Ti/Al or the like is formed by using the third resist pattern 73 as a mask. Subsequently, the third resist pattern 73 is lifted off so that the gate electrode 36 is formed.

Figure 44A:
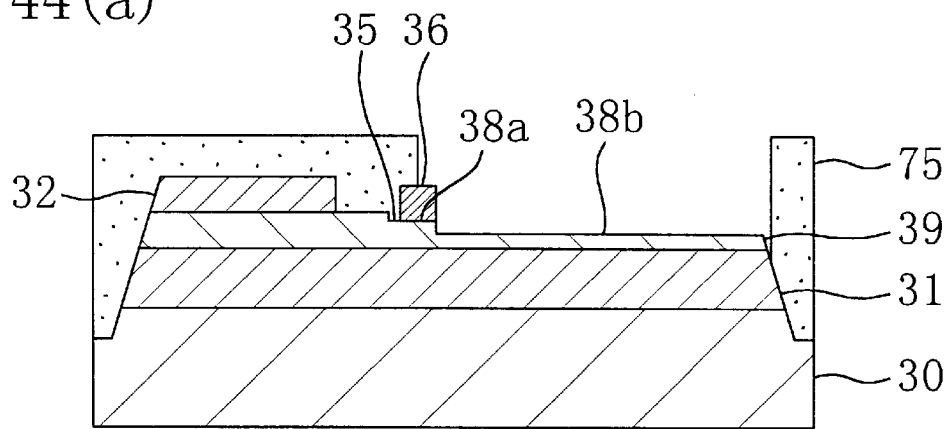
FIGS. 44($a$) and 44($b$) are cross-sectional views illustrating individual process steps in accordance with the method of manufacturing the second FET of the third embodiment.

Next, as shown in FIG. 44(a), a fourth resist pattern 75 is formed on the semi-insulating substrate 30. Then, wet etching is performed by using the fourth resist pattern 75 and the gate electrode 36 as a mask to remove the drain-side surface region of the undoped layer 39 to form the first step having the upper portion 38a and the lower portion 38b. After that, the fourth resist pattern 75 is removed.

Figure 44B:
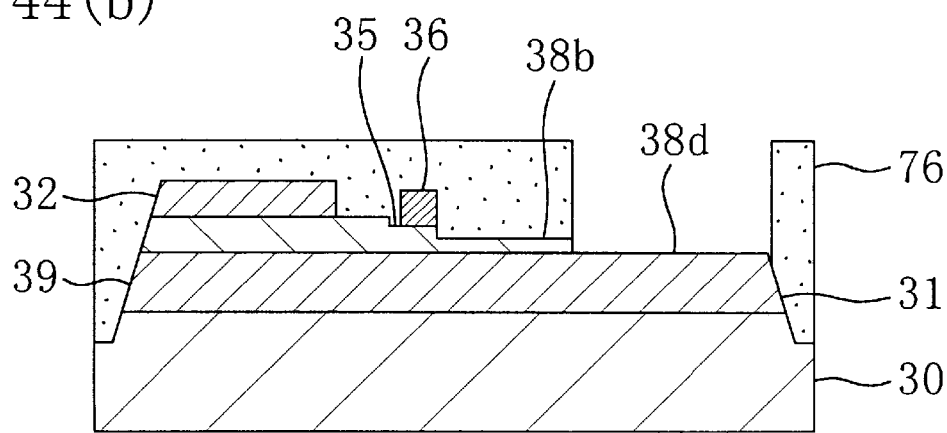

Next, as shown in FIG. 44(b), a fifth resist pattern 76 is formed on the semi-insulating substrate 30. Then, the drain-side region of the undoped layer 39 is removed by wet etching using the fifth resist pattern 76 as a mask to form the second step having the upper portion 38b (corresponding to the lower portion of the first step) and the lower portion 38d. After that, the fifth resist pattern 76 is removed.

Figure 45A:
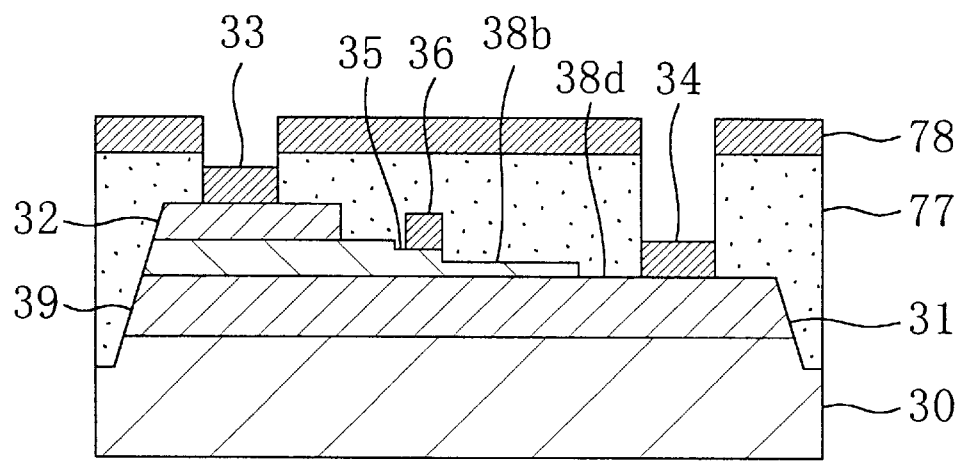
FIGS. 45($a$) and 45($b$) are cross-sectional views illustrating individual process steps in accordance with the method of manufacturing the second FET of the third embodiment.

Next, as shown in FIG. 45(a), a sixth resist pattern 77 is formed on the semi-insulating substrate 30. Then, a second metal film 78 made of vapor deposited AuGe or the like is formed by using the sixth resist pattern 77 as a mask. Subsequently, the sixth resist pattern 77 is lifted off so that the source electrode 33 and the drain electrode 34 are formed.

Figure 45B:
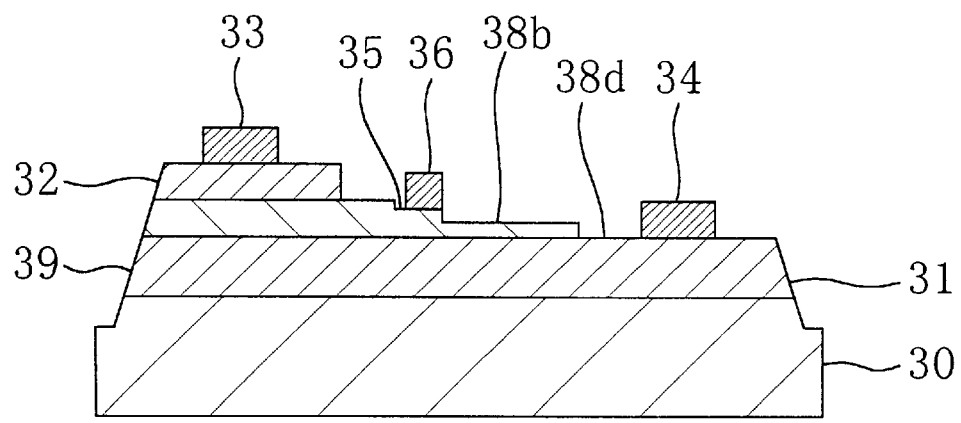

Next, the sixth resist pattern 77 is removed, whereby the second FET according to the third embodiment as shown in FIG. 45(b) is completed.

We claim:

1. A field-effect transistor comprising:

a semiconductor substrate;

a conductive layer formed on said semiconductor substrate;

a source electrode and a drain electrode formed on respective specified regions of said conductive layer to be in ohmic contact with said conductive layer;

a gate electrode formed on a region of said conductive layer located between said source electrode and said drain electrode to form a Schottky junction with said conductive layer; and a trench formed in a region of said conductive layer located between said gate electrode and said drain electrode, wherein said trench includes a plurality of trenches formed in said region of said conductive layer located between said gate electrode and said drain electrode.

2. A field-effect transistor comprising:

a semiconductor substrate;

a conductive layer formed on said semiconductor substrate;

a semiconductor layer formed on said conductive layer;

a source electrode and a drain electrode formed on respective specified regions of said semiconductor layer to be in ohmic contact with said semiconductor layer;

a gate electrode formed in a region of said semiconductor layer located between said source electrode and said drain electrode to form a Schottky junction with said semiconductor layer; and a trench formed in a region of said semiconductor layer located between said gate electrode and said drain electrode, wherein said trench includes a plurality of trenches formed in said region of said semiconductor layer located between said gate electrode and said drain electrode.

* * * * *